(12) United States Patent
Pralle et al.

(10) Patent No.: US 10,224,359 B2
(45) Date of Patent: Mar. 5, 2019

(54) PIXEL ISOLATION ELEMENTS, DEVICES AND ASSOCIATED METHODS

(71) Applicant: SiOnyx, LLC., Beverly, MA (US)

(72) Inventors: Martin U. Pralle, Wayland, MA (US); Jeffrey McKee, Tualatin, OR (US); Jason Sickler, Arlington, MA (US)

(73) Assignee: SiOnyx, LLC, Beverly, MA (US)

( * ) Notice: Subject to any disclaimer, the term of this patent is extended or adjusted under 35 U.S.C. 154(b) by 0 days.

(21) Appl. No.: 15/216,244

(22) Filed: Jul. 21, 2016

(65) Prior Publication Data
US 2016/0329366 A1    Nov. 10, 2016

Related U.S. Application Data

(63) Continuation of application No. 14/747,875, filed on Jun. 23, 2015, now Pat. No. 9,905,599, which is a
(Continued)

(51) Int. Cl.
*H01L 27/146* (2006.01)

(52) U.S. Cl.
CPC ...... *H01L 27/1463* (2013.01); *H01L 27/1462* (2013.01); *H01L 27/14607* (2013.01);
(Continued)

(58) Field of Classification Search
None
See application file for complete search history.

(56) References Cited

U.S. PATENT DOCUMENTS

| 3,487,223 A | 12/1969 | St. John |
| 3,922,571 A | 11/1975 | Smith |

(Continued)

FOREIGN PATENT DOCUMENTS

| AU | 3666484 | 6/1985 |
| CN | 101241923 | 8/2008 |

(Continued)

OTHER PUBLICATIONS

A. Arndt, J.F. Allison, J.G. Haynos, and A. Meulenberg, Jr., "Optical Properties of the COMSAT Non-reflective Cell," 11th IEEE Photovoltaic Spec. Conf., p. 40, 1975.
(Continued)

*Primary Examiner* — Long Pham
(74) *Attorney, Agent, or Firm* — Thomas J. Engellenner; Reza Mollaaghababa; Pepper Hamilton LLP

(57) ABSTRACT

Light trapping pixels, devices incorporating such pixels, and various associated methods are provided. In one aspect, for example, a light trapping pixel device can include a light sensitive pixel having a light incident surface, a backside surface opposite the light incident surface, and a peripheral sidewall disposed into at least a portion of the pixel and extending at least substantially around the pixel periphery. The pixel can also include a backside light trapping material substantially covering the backside surface and a peripheral light trapping material substantially covering the peripheral sidewall. The light contacting the backside light trapping material or the peripheral light trapping material is thus reflected back toward the pixel.

83 Claims, 4 Drawing Sheets

Related U.S. Application Data continuation of application No. 13/841,120, filed on Mar. 15, 2013, now Pat. No. 9,064,764.

(60) Provisional application No. 61/614,275, filed on Mar. 22, 2012.

(52) U.S. Cl.
CPC .. *H01L 27/14625* (2013.01); *H01L 27/14627* (2013.01); *H01L 27/14629* (2013.01); *H01L 27/14645* (2013.01); *H01L 27/14685* (2013.01); *H01L 27/14689* (2013.01)

(56) References Cited

U.S. PATENT DOCUMENTS

| | | |
|---|---|---|
| 3,973,994 A | 8/1976 | Redfield |
| 3,994,012 A | 11/1976 | Warner, Jr. |
| 4,017,887 A | 4/1977 | Davies et al. |
| 4,149,174 A | 4/1979 | Shannon |
| 4,176,365 A | 11/1979 | Kroger |
| 4,201,450 A | 5/1980 | Trapani |
| 4,242,149 A | 12/1980 | King et al. |
| 4,253,882 A | 3/1981 | Dalal |
| 4,277,793 A | 7/1981 | Webb |
| 4,322,571 A | 3/1982 | Stanbery |
| 4,419,533 A | 12/1983 | Czubatyj et al. |
| 4,452,826 A | 6/1984 | Shields et al. |
| 4,493,942 A | 1/1985 | Sheng et al. |
| 4,514,582 A | 4/1985 | Tiedje et al. |
| 4,536,608 A | 8/1985 | Sheng et al. |
| 4,546,945 A | 10/1985 | Nessfield |
| 4,568,960 A | 2/1986 | Petroff et al. |
| 4,593,303 A | 6/1986 | Dyck et al. |
| 4,593,313 A | 6/1986 | Nagasaki |
| 4,617,593 A | 10/1986 | Dudley |
| 4,630,082 A | 12/1986 | Sakai |
| 4,648,936 A | 3/1987 | Ashby et al. |
| 4,663,188 A | 5/1987 | Kane |
| 4,672,206 A | 6/1987 | Suzuki |
| 4,673,770 A | 6/1987 | Mandelkorn |
| 4,679,068 A | 7/1987 | Lillquist et al. |
| 4,751,571 A | 6/1988 | Lillquist |
| 4,775,425 A | 10/1988 | Guha et al. |
| 4,777,490 A | 10/1988 | Sharma et al. |
| 4,829,013 A | 5/1989 | Yamazaki |
| 4,883,962 A | 11/1989 | Elliot |
| 4,886,958 A | 12/1989 | Merryman |
| 4,887,255 A | 12/1989 | Handa et al. |
| 4,894,526 A | 1/1990 | Bethea et al. |
| 4,910,568 A | 3/1990 | Taki et al. |
| 4,910,588 A | 3/1990 | Kinoshita et al. |
| 4,964,134 A | 10/1990 | Westbrook et al. |
| 4,965,784 A | 10/1990 | Land et al. |
| 4,968,372 A | 11/1990 | Maass |
| 4,999,308 A | 3/1991 | Nishiura et al. |
| 5,021,100 A | 6/1991 | Ishihara et al. |
| 5,021,854 A | 6/1991 | Huth |
| 5,080,725 A | 1/1992 | Green et al. |
| 5,081,049 A | 1/1992 | Green et al. |
| 5,100,478 A | 3/1992 | Kawabata |
| 5,101,260 A | 3/1992 | Nath |
| 5,114,876 A | 5/1992 | Weiner |
| 5,127,964 A | 7/1992 | Hamakawa et al. |
| 5,164,324 A | 11/1992 | Russell et al. |
| 5,208,822 A | 5/1993 | Haus et al. |
| 5,223,043 A | 6/1993 | Olson et al. |
| 5,234,790 A | 8/1993 | Lang et al. |
| 5,236,863 A | 8/1993 | Iranmesh |
| 5,244,817 A | 9/1993 | Hawkins et al. |
| 5,296,045 A | 3/1994 | Banerjee et al. |
| 5,309,275 A | 5/1994 | Nishimura et al. |
| 5,322,988 A | 6/1994 | Russell et al. |
| 5,346,850 A | 9/1994 | Kaschmitter et al. |
| 5,351,446 A | 10/1994 | Langsdorf |
| 5,370,747 A | 12/1994 | Noguchi et al. |
| 5,373,182 A | 12/1994 | Norton |
| 5,381,431 A | 1/1995 | Zayhowski |
| 5,383,217 A | 1/1995 | Uemura |
| 5,390,201 A | 2/1995 | Tomono et al. |
| 5,410,168 A | 4/1995 | Hisa |
| 5,413,100 A | 5/1995 | Barthelemy et al. |
| 5,449,626 A | 9/1995 | Hezel |
| 5,454,347 A | 10/1995 | Shibata et al. |
| 5,502,329 A | 3/1996 | Pezzani |
| 5,523,570 A | 6/1996 | Hairston |
| 5,559,361 A | 9/1996 | Pezzani |
| 5,569,615 A | 10/1996 | Yamazaki et al. |
| 5,578,858 A | 11/1996 | Mueller et al. |
| 5,580,615 A | 12/1996 | Itoh et al. |
| 5,583,704 A | 12/1996 | Fujii |
| 5,589,008 A | 12/1996 | Kepper |
| 5,589,704 A | 12/1996 | Levine |
| 5,597,621 A | 1/1997 | Hummel et al. |
| 5,600,130 A | 2/1997 | VanZeghbroeck |
| 5,626,687 A | 5/1997 | Campbell |
| 5,627,081 A | 5/1997 | Tsuo et al. |
| 5,635,089 A | 6/1997 | Singh et al. |
| 5,640,013 A | 6/1997 | Ishikawa et al. |
| 5,641,362 A | 6/1997 | Meier |
| 5,641,969 A | 6/1997 | Cooke et al. |
| 5,705,413 A | 1/1998 | Harkin et al. |
| 5,705,828 A | 1/1998 | Noguchi et al. |
| 5,708,486 A | 1/1998 | Miyawaki et al. |
| 5,710,442 A | 1/1998 | Watanabe et al. |
| 5,714,404 A | 2/1998 | Mititsky et al. |
| 5,727,096 A | 3/1998 | Ghirardi et al. |
| 5,731,213 A | 3/1998 | Ono |
| 5,751,005 A | 5/1998 | Wyles et al. |
| 5,758,644 A | 6/1998 | Diab et al. |
| 5,766,127 A | 6/1998 | Pologe et al. |
| 5,766,964 A | 6/1998 | Rohatgi et al. |
| 5,773,820 A | 6/1998 | Osajda et al. |
| 5,779,631 A | 7/1998 | Chance |
| 5,781,392 A | 7/1998 | Clark |
| 5,792,280 A | 8/1998 | Ruby et al. |
| 5,802,091 A | 8/1998 | Chakrabarti et al. |
| 5,808,350 A | 9/1998 | Jack et al. |
| 5,859,446 A | 1/1999 | Nagasu et al. |
| 5,861,639 A | 1/1999 | Bernier |
| 5,923,071 A | 7/1999 | Saito |
| 5,935,320 A | 8/1999 | Graf et al. |
| 5,942,789 A | 8/1999 | Morikawa |
| 5,943,584 A | 8/1999 | Shim et al. |
| 5,963,790 A | 10/1999 | Matsuno et al. |
| 5,977,603 A | 11/1999 | Ishikawa |
| 6,071,796 A | 6/2000 | Voutsas |
| 6,072,117 A | 6/2000 | Matsuyama et al. |
| 6,080,988 A | 6/2000 | Ishizuya et al. |
| 6,082,858 A | 7/2000 | Grace et al. |
| 6,097,031 A | 8/2000 | Cole |
| 6,106,689 A | 8/2000 | Matsuyama |
| 6,107,618 A | 8/2000 | Fossum et al. |
| 6,111,300 A | 8/2000 | Cao et al. |
| 6,131,511 A | 10/2000 | Wachi et al. |
| 6,131,512 A | 10/2000 | Verlinden et al. |
| 6,147,297 A | 11/2000 | Wettling et al. |
| 6,160,833 A | 12/2000 | Floyd et al. |
| 6,168,965 B1 | 1/2001 | Malinovich et al. |
| 6,194,722 B1 | 2/2001 | Fiorini et al. |
| 6,204,506 B1 | 3/2001 | Akahori et al. |
| 6,229,192 B1 | 5/2001 | Gu |
| 6,252,256 B1 | 6/2001 | Ugge et al. |
| 6,290,713 B1 | 9/2001 | Russell |
| 6,291,302 B1 | 9/2001 | Yu |
| 6,313,901 B1 | 11/2001 | Cacharelis |
| 6,320,296 B1 | 11/2001 | Fujii et al. |
| 6,327,022 B1 | 12/2001 | Nishi |
| 6,331,445 B1 | 12/2001 | Janz et al. |
| 6,331,885 B1 | 12/2001 | Nishi |
| 6,340,281 B1 | 1/2002 | Haraguchi |
| 6,372,591 B1 | 4/2002 | Mineji et al. |
| 6,372,611 B1 | 4/2002 | Horikawa |
| 6,379,979 B1 | 4/2002 | Connolly |

(56) References Cited

U.S. PATENT DOCUMENTS

| | | |
|---|---|---|
| 6,420,706 B1 | 7/2002 | Lurie et al. |
| 6,429,036 B1 | 8/2002 | Nixon et al. |
| 6,429,037 B1 | 8/2002 | Wenham et al. |
| 6,465,860 B2 | 10/2002 | Shigenaka et al. |
| 6,475,839 B2 | 11/2002 | Zhang et al. |
| 6,479,093 B2 | 11/2002 | Lauffer et al. |
| 6,483,116 B1 | 11/2002 | Kozlowski et al. |
| 6,483,929 B1 | 11/2002 | Marakami et al. |
| 6,486,522 B1 | 11/2002 | Bishay et al. |
| 6,493,567 B1 | 12/2002 | Krivitski et al. |
| 6,498,336 B1 | 12/2002 | Tian et al. |
| 6,500,690 B1 | 12/2002 | Yamagishi et al. |
| 6,504,178 B2 | 1/2003 | Carlson et al. |
| 6,580,053 B1 | 6/2003 | Voutsas |
| 6,583,936 B1 | 6/2003 | Kaminsky et al. |
| 6,597,025 B2 | 7/2003 | Lauter et al. |
| 6,607,927 B2 | 8/2003 | Ramappa et al. |
| 6,624,049 B1 | 9/2003 | Yamazaki |
| 6,639,253 B2 | 10/2003 | Duane et al. |
| 6,667,528 B2 | 12/2003 | Cohen et al. |
| 6,677,655 B2 | 1/2004 | Fitzgerald |
| 6,677,656 B2 | 1/2004 | Francois |
| 6,683,326 B2 | 1/2004 | Iguchi et al. |
| 6,689,209 B2 | 2/2004 | Falster et al. |
| 6,690,968 B2 | 2/2004 | Mejia |
| 6,753,585 B1 | 6/2004 | Kindt |
| 6,759,262 B2 | 7/2004 | Theil et al. |
| 6,790,701 B2 | 9/2004 | Shigenaka et al. |
| 6,800,541 B2 | 10/2004 | Okumura |
| 6,801,799 B2 | 10/2004 | Mendelson |
| 6,803,555 B1 | 10/2004 | Parrish et al. |
| 6,815,685 B2 | 11/2004 | Wany |
| 6,818,535 B2 | 11/2004 | Lu et al. |
| 6,822,313 B2 | 11/2004 | Matsushita |
| 6,825,057 B1 | 11/2004 | Heyers et al. |
| 6,864,156 B1 | 3/2005 | Conn |
| 6,864,190 B2 | 3/2005 | Han et al. |
| 6,867,806 B1 | 3/2005 | Lee et al. |
| 6,900,839 B1 | 5/2005 | Kozlowski et al. |
| 6,907,135 B2 | 6/2005 | Gifford |
| 6,911,375 B2 | 6/2005 | Guarini et al. |
| 6,919,587 B2 | 7/2005 | Ballon et al. |
| 6,923,625 B2 | 8/2005 | Sparks |
| 6,927,432 B2 | 8/2005 | Holm et al. |
| 6,984,816 B2 | 1/2006 | Holm et al. |
| 7,008,854 B2 | 3/2006 | Forbes |
| 7,041,525 B2 | 5/2006 | Clevenger et al. |
| 7,057,256 B2 | 6/2006 | Carey, III et al. |
| 7,075,079 B2 | 7/2006 | Wood |
| 7,091,411 B2 | 8/2006 | Falk et al. |
| 7,109,517 B2 | 9/2006 | Zaidi |
| 7,126,212 B2 | 10/2006 | Enquist et al. |
| 7,132,724 B1 | 11/2006 | Merrill |
| 7,202,102 B2 | 4/2007 | Yao |
| 7,211,501 B2 | 5/2007 | Liu et al. |
| 7,235,812 B2 | 6/2007 | Chu et al. |
| 7,247,527 B2 | 7/2007 | Shimomura et al. |
| 7,247,812 B2 | 7/2007 | Tsao |
| 7,256,102 B2 | 8/2007 | Nakata et al. |
| 7,271,445 B2 | 9/2007 | Forbes |
| 7,271,835 B2 | 9/2007 | Iizuka et al. |
| 7,285,482 B2 | 10/2007 | Ochi |
| 7,314,832 B2 | 1/2008 | Kountz et al. |
| 7,315,014 B2 | 1/2008 | Lee et al. |
| 7,354,792 B2 | 4/2008 | Carey, III et al. |
| 7,358,498 B2 | 4/2008 | Geng et al. |
| 7,375,378 B2 | 5/2008 | Manivannan et al. |
| 7,390,689 B2 | 6/2008 | Mazur et al. |
| 7,432,148 B2 | 10/2008 | Li et al. |
| 7,442,629 B2 | 10/2008 | Mazur et al. |
| 7,446,359 B2 | 11/2008 | Lee et al. |
| 7,446,807 B2 | 11/2008 | Hong |
| 7,456,452 B2 | 11/2008 | Wells et al. |
| 7,482,532 B2 | 1/2009 | Yi et al. |
| 7,498,650 B2 | 3/2009 | Lauxtermann |
| 7,504,325 B2 | 3/2009 | Koezuka et al. |
| 7,504,702 B2 | 3/2009 | Mazur et al. |
| 7,511,750 B2 | 3/2009 | Murakami |
| 7,521,737 B2 | 4/2009 | Augusto |
| 7,528,463 B2 | 5/2009 | Forbes |
| 7,542,085 B2 | 6/2009 | Altice, Jr. et al. |
| 7,547,616 B2 | 6/2009 | Fogel et al. |
| 7,551,059 B2 | 6/2009 | Farrier |
| 7,560,750 B2 | 7/2009 | Niira et al. |
| 7,564,631 B2 | 7/2009 | Li et al. |
| 7,582,515 B2 | 9/2009 | Choi et al. |
| 7,592,593 B2 | 9/2009 | Kauffman et al. |
| 7,595,213 B2 | 9/2009 | Kwon et al. |
| 7,605,397 B2 | 10/2009 | Kindem et al. |
| 7,615,808 B2 | 11/2009 | Pain et al. |
| 7,618,839 B2 | 11/2009 | Rhodes |
| 7,619,269 B2 | 11/2009 | Ohkawa |
| 7,629,582 B2 | 12/2009 | Hoffman et al. |
| 7,648,851 B2 | 1/2010 | Fu et al. |
| 7,649,156 B2 | 1/2010 | Lee |
| 7,705,879 B2 | 4/2010 | Kerr et al. |
| 7,728,274 B2 | 6/2010 | Pilla et al. |
| 7,731,665 B2 | 6/2010 | Lee et al. |
| 7,741,666 B2 | 6/2010 | Nozaki et al. |
| 7,745,901 B1 | 6/2010 | McCaffrey et al. |
| 7,763,913 B2 | 7/2010 | Fan et al. |
| 7,772,028 B2 | 8/2010 | Adkisson et al. |
| 7,781,856 B2 | 8/2010 | Mazur et al. |
| 7,800,192 B2 | 9/2010 | Venezia et al. |
| 7,800,684 B2 | 9/2010 | Tatani |
| 7,816,220 B2 | 10/2010 | Mazur et al. |
| 7,828,983 B2 | 11/2010 | Weber et al. |
| 7,847,253 B2 | 12/2010 | Carey et al. |
| 7,847,326 B2 | 12/2010 | Park et al. |
| 7,855,406 B2 | 12/2010 | Yamaguchi et al. |
| 7,875,498 B2 | 1/2011 | Elbanhawy et al. |
| 7,880,168 B2 | 2/2011 | Lenchenkov |
| 7,884,439 B2 | 2/2011 | Mazur et al. |
| 7,884,446 B2 | 2/2011 | Mazur et al. |
| 7,897,942 B1 | 3/2011 | Bereket |
| 7,910,964 B2 | 3/2011 | Kawahito et al. |
| 7,923,801 B2 | 4/2011 | Tian et al. |
| 7,968,834 B2 | 6/2011 | Veeder |
| 8,008,205 B2 | 8/2011 | Fukushima et al. |
| 8,013,411 B2 | 9/2011 | Cole |
| 8,030,726 B2 | 10/2011 | Sumi |
| 8,035,343 B2 | 10/2011 | Seman, Jr. |
| 8,058,615 B2 | 11/2011 | McCaffrey |
| 8,076,746 B2 | 12/2011 | McCarten et al. |
| 8,080,467 B2 | 12/2011 | Carey et al. |
| 8,088,219 B2 | 1/2012 | Knerer et al. |
| 8,093,559 B1 | 1/2012 | Rajavel |
| RE43,169 E | 2/2012 | Parker |
| 8,164,126 B2 | 4/2012 | Moon et al. |
| 8,207,051 B2 | 6/2012 | Sickler et al. |
| 8,247,259 B2 | 8/2012 | Grolier et al. |
| 8,259,293 B2 | 9/2012 | Andreou et al. |
| 8,268,403 B2 | 9/2012 | Akiyama et al. |
| 8,288,702 B2 | 10/2012 | Veeder |
| 8,445,950 B2 | 5/2013 | Iida et al. |
| 8,445,985 B2 | 5/2013 | Hiyama et al. |
| 8,470,619 B2* | 6/2013 | Bour .................. H01L 21/268 257/98 |
| 8,476,681 B2 | 7/2013 | Haddad et al. |
| 8,530,264 B2 | 9/2013 | De Munck et al. |
| 8,564,087 B2 | 10/2013 | Yamamura et al. |
| 8,603,902 B2 | 12/2013 | Mazer et al. |
| 8,604,405 B2 | 12/2013 | Liu et al. |
| 8,629,485 B2 | 1/2014 | Yamamura et al. |
| 8,680,591 B2 | 3/2014 | Haddad et al. |
| 8,729,678 B2 | 5/2014 | Shim et al. |
| 8,742,528 B2 | 6/2014 | Yamamura et al. |
| 8,884,226 B2 | 11/2014 | Miyazaki et al. |
| 8,906,670 B2* | 12/2014 | Gray .................. G01N 21/6452 422/407 |
| 8,916,945 B2 | 12/2014 | Sakamoto et al. |
| 8,928,784 B2 | 1/2015 | Watanabe et al. |
| 8,994,135 B2 | 6/2015 | Yamamura et al. |
| 9,064,762 B2 | 6/2015 | Yamaguchi |

(56) References Cited

U.S. PATENT DOCUMENTS

| | | |
|---|---|---|
| 9,184,204 B2 | 11/2015 | Hu |
| 9,190,551 B2 | 11/2015 | Yamamura et al. |
| 9,369,641 B2 | 6/2016 | Hu |
| 9,419,159 B2 | 8/2016 | Sakamoto et al. |
| 9,478,572 B2 | 10/2016 | Miyanami |
| 9,659,984 B2 | 5/2017 | Ohkubo et al. |
| 9,673,250 B2 | 6/2017 | Haddad et al. |
| 2001/0017344 A1 | 8/2001 | Aebi |
| 2001/0022768 A1 | 9/2001 | Takahashi |
| 2001/0044175 A1 | 11/2001 | Barrett et al. |
| 2001/0044266 A1 | 11/2001 | Katsuoka |
| 2002/0020893 A1 | 2/2002 | Lhorte |
| 2002/0024618 A1 | 2/2002 | Imai |
| 2002/0056845 A1 | 5/2002 | Iguchi et al. |
| 2002/0060322 A1 | 5/2002 | Tanabe et al. |
| 2002/0079290 A1 | 6/2002 | Holdermann |
| 2002/0117699 A1 | 8/2002 | Roy |
| 2002/0148964 A1 | 10/2002 | Dausch et al. |
| 2002/0182769 A1 | 12/2002 | Campbell |
| 2003/0029495 A1 | 2/2003 | Mazur et al. |
| 2003/0030083 A1 | 2/2003 | Lee et al. |
| 2003/0045092 A1 | 3/2003 | Shin |
| 2003/0057357 A1 | 3/2003 | Uppal et al. |
| 2003/0111106 A1 | 6/2003 | Nagano et al. |
| 2003/0210332 A1 | 11/2003 | Frame |
| 2003/0213515 A1 | 11/2003 | Sano et al. |
| 2003/0214595 A1 | 11/2003 | Mabuchi |
| 2003/0228883 A1 | 12/2003 | Kusakari et al. |
| 2004/0014307 A1 | 1/2004 | Shin et al. |
| 2004/0016886 A1 | 1/2004 | Ringermacher et al. |
| 2004/0041168 A1 | 3/2004 | Hembree et al. |
| 2004/0046224 A1 | 3/2004 | Rossel et al. |
| 2004/0077117 A1 | 4/2004 | Ding et al. |
| 2004/0080638 A1 | 4/2004 | Lee |
| 2004/0130020 A1 | 7/2004 | Kuwabara et al. |
| 2004/0161868 A1 | 8/2004 | Hong |
| 2004/0222187 A1 | 11/2004 | Lin |
| 2004/0252931 A1 | 12/2004 | Belleville et al. |
| 2004/0256561 A1 | 12/2004 | Beuhler et al. |
| 2005/0051822 A1 | 3/2005 | Manning |
| 2005/0062041 A1 | 3/2005 | Terakawa et al. |
| 2005/0088634 A1 | 4/2005 | Kosugi |
| 2005/0093100 A1 | 5/2005 | Tze-Chiang et al. |
| 2005/0101100 A1 | 5/2005 | Kretchmer et al. |
| 2005/0101160 A1 | 5/2005 | Garg et al. |
| 2005/0127401 A1 | 6/2005 | Mazur et al. |
| 2005/0134698 A1 | 6/2005 | Schroeder et al. |
| 2005/0150542 A1 | 7/2005 | Madan |
| 2005/0158969 A1 | 7/2005 | Binnis et al. |
| 2005/0184291 A1 | 8/2005 | Cole et al. |
| 2005/0184353 A1 | 8/2005 | Mouli |
| 2005/0211996 A1 | 9/2005 | Krishna et al. |
| 2005/0227390 A1 | 10/2005 | Shtein et al. |
| 2006/0006482 A1 | 1/2006 | Rieve et al. |
| 2006/0011954 A1 | 1/2006 | Ueda et al. |
| 2006/0011955 A1 | 1/2006 | Baggenstoss |
| 2006/0060848 A1 | 3/2006 | Chang et al. |
| 2006/0071254 A1 | 4/2006 | Rhodes |
| 2006/0079062 A1 | 4/2006 | Mazur et al. |
| 2006/0086956 A1 | 4/2006 | Furukawa et al. |
| 2006/0097172 A1 | 5/2006 | Park |
| 2006/0118781 A1 | 6/2006 | Rhodes |
| 2006/0121680 A1 | 6/2006 | Tanaka |
| 2006/0128087 A1 | 6/2006 | Bamji et al. |
| 2006/0132633 A1 | 6/2006 | Nam et al. |
| 2006/0138396 A1 | 6/2006 | Lin et al. |
| 2006/0145148 A1 | 7/2006 | Hirai et al. |
| 2006/0145176 A1 | 7/2006 | Lee |
| 2006/0160343 A1 | 7/2006 | Chong et al. |
| 2006/0166475 A1 | 7/2006 | Mantl |
| 2006/0175529 A1 | 8/2006 | Harmon et al. |
| 2006/0180885 A1 | 8/2006 | Rhodes |
| 2006/0181627 A1 | 8/2006 | Farrier |
| 2006/0210122 A1 | 9/2006 | Cleveland |
| 2006/0214121 A1 | 9/2006 | Schrey et al. |
| 2006/0228897 A1 | 10/2006 | Timans |
| 2006/0231914 A1 | 10/2006 | Carey et al. |
| 2006/0238632 A1 | 10/2006 | Shah |
| 2006/0244090 A1 | 11/2006 | Roy et al. |
| 2006/0255340 A1 | 11/2006 | Manivannan et al. |
| 2006/0257140 A1 | 11/2006 | Seger |
| 2007/0035849 A1 | 2/2007 | Li et al. |
| 2007/0035879 A1 | 2/2007 | Hall et al. |
| 2007/0051876 A1 | 3/2007 | Sumi et al. |
| 2007/0052050 A1 | 3/2007 | Dierickx |
| 2007/0063219 A1 | 3/2007 | Sa'ar et al. |
| 2007/0076481 A1 | 4/2007 | Tennant |
| 2007/0103580 A1 | 5/2007 | Noto |
| 2007/0115554 A1 | 5/2007 | Breitung et al. |
| 2007/0123005 A1 | 5/2007 | Hiura et al. |
| 2007/0125951 A1 | 6/2007 | Snider et al. |
| 2007/0138590 A1 | 6/2007 | Wells et al. |
| 2007/0145505 A1 | 6/2007 | Kim et al. |
| 2007/0178672 A1 | 8/2007 | Tanaka et al. |
| 2007/0187670 A1 | 8/2007 | Hsu et al. |
| 2007/0189583 A1 | 8/2007 | Shimada et al. |
| 2007/0194356 A1 | 8/2007 | Moon et al. |
| 2007/0194401 A1 | 8/2007 | Nagai et al. |
| 2007/0195056 A1 | 8/2007 | Lloyd |
| 2007/0200940 A1 | 8/2007 | Gruhlke et al. |
| 2007/0201859 A1 | 8/2007 | Sarrat |
| 2007/0235827 A1 | 10/2007 | Altice |
| 2007/0237504 A1 | 10/2007 | Nakashiba |
| 2007/0247414 A1 | 10/2007 | Roberts |
| 2007/0262366 A1 | 11/2007 | Baek et al. |
| 2007/0290283 A1 | 12/2007 | Park et al. |
| 2007/0296060 A1 | 12/2007 | Tanabe et al. |
| 2008/0002863 A1 | 1/2008 | Northcott |
| 2008/0020555 A1 | 1/2008 | Shimomura et al. |
| 2008/0026550 A1 | 1/2008 | Werner et al. |
| 2008/0036022 A1 | 2/2008 | Hwang et al. |
| 2008/0044943 A1 | 2/2008 | Mazur et al. |
| 2008/0076240 A1 | 3/2008 | Veschtti et al. |
| 2008/0099804 A1 | 5/2008 | Venezia |
| 2008/0121280 A1 | 5/2008 | Carnel et al. |
| 2008/0121805 A1 | 5/2008 | Tweet et al. |
| 2008/0142686 A1 | 6/2008 | Konno et al. |
| 2008/0158398 A1 | 7/2008 | Yoel et al. |
| 2008/0170173 A1 | 7/2008 | Park et al. |
| 2008/0173620 A1 | 7/2008 | Grek |
| 2008/0174685 A1 | 7/2008 | Shan et al. |
| 2008/0178932 A1 | 7/2008 | Den Boer et al. |
| 2008/0179762 A1 | 7/2008 | Cho et al. |
| 2008/0191296 A1 | 8/2008 | Wang et al. |
| 2008/0191310 A1 | 8/2008 | Wu et al. |
| 2008/0192132 A1 | 8/2008 | Bechtel et al. |
| 2008/0192133 A1 | 8/2008 | Takahiro et al. |
| 2008/0196761 A1 | 8/2008 | Nakano et al. |
| 2008/0198251 A1 | 8/2008 | Xu et al. |
| 2008/0202576 A1 | 8/2008 | Hieslmair |
| 2008/0213936 A1 | 9/2008 | Hatai |
| 2008/0223436 A1 | 9/2008 | den Boer et al. |
| 2008/0242005 A1 | 10/2008 | Dozen et al. |
| 2008/0257409 A1 | 10/2008 | Li et al. |
| 2008/0258604 A1 | 10/2008 | Mazur et al. |
| 2008/0266434 A1 | 10/2008 | Sugawa et al. |
| 2008/0266435 A1 | 10/2008 | Agranov et al. |
| 2008/0281174 A1 | 11/2008 | Dietiker |
| 2008/0284884 A1 | 11/2008 | Eiji et al. |
| 2008/0303932 A1 | 12/2008 | Wang et al. |
| 2008/0309913 A1 | 12/2008 | Fallon |
| 2009/0002528 A1 | 1/2009 | Manabe et al. |
| 2009/0009596 A1 | 1/2009 | Kerr et al. |
| 2009/0014056 A1 | 1/2009 | Hockaday |
| 2009/0027640 A1 | 1/2009 | Shibazaki |
| 2009/0038669 A1 | 2/2009 | Atanackovic |
| 2009/0039397 A1 | 2/2009 | Chao |
| 2009/0050944 A1 | 2/2009 | Hong |
| 2009/0056797 A1 | 3/2009 | Barnett et al. |
| 2009/0057536 A1 | 3/2009 | Hirose |
| 2009/0065051 A1 | 3/2009 | Chan et al. |
| 2009/0078316 A1 | 3/2009 | Khazeni et al. |
| 2009/0090988 A1 | 4/2009 | Ohgishi |
| 2009/0093100 A1 | 4/2009 | Xia et al. |

(56) References Cited

U.S. PATENT DOCUMENTS

| | | |
|---|---|---|
| 2009/0095887 A1 | 4/2009 | Saveliev |
| 2009/0096049 A1 | 4/2009 | Oshiyama et al. |
| 2009/0097290 A1 | 4/2009 | Chandrasekaran |
| 2009/0109305 A1 | 4/2009 | Dai et al. |
| 2009/0114630 A1 | 5/2009 | Hawryluk |
| 2009/0142879 A1 | 6/2009 | Isaka et al. |
| 2009/0146240 A1 | 6/2009 | Carey, III et al. |
| 2009/0160983 A1 | 6/2009 | Lenchenkov |
| 2009/0174026 A1 | 7/2009 | Carey et al. |
| 2009/0180010 A1 | 7/2009 | Adikisson et al. |
| 2009/0194671 A1 | 8/2009 | Nozaki et al. |
| 2009/0200454 A1 | 8/2009 | Barbier et al. |
| 2009/0200586 A1 | 8/2009 | Mao et al. |
| 2009/0200625 A1 | 8/2009 | Venezia et al. |
| 2009/0200626 A1 | 8/2009 | Qian et al. |
| 2009/0200631 A1 | 8/2009 | Tai et al. |
| 2009/0206237 A1 | 8/2009 | Shannon et al. |
| 2009/0211627 A1 | 8/2009 | Meier et al. |
| 2009/0213883 A1 | 8/2009 | Mazur et al. |
| 2009/0218493 A1 | 9/2009 | McCaffrey et al. |
| 2009/0223561 A1 | 9/2009 | Kim et al. |
| 2009/0227061 A1 | 9/2009 | Bateman et al. |
| 2009/0242019 A1 | 10/2009 | Ramamoorthy et al. |
| 2009/0242032 A1 | 10/2009 | Yamazaki et al. |
| 2009/0242933 A1 | 10/2009 | Hu et al. |
| 2009/0256156 A1 | 10/2009 | Hsieh |
| 2009/0256226 A1 | 10/2009 | Tatani |
| 2009/0261255 A1 | 10/2009 | Nakamura et al. |
| 2009/0278967 A1 | 11/2009 | Toumiya |
| 2009/0283807 A1 | 11/2009 | Adkisson et al. |
| 2009/0294787 A1 | 12/2009 | Nakaji et al. |
| 2009/0308450 A1 | 12/2009 | Adibi et al. |
| 2009/0308457 A1 | 12/2009 | Smith et al. |
| 2010/0000597 A1 | 1/2010 | Cousins |
| 2010/0013036 A1 | 1/2010 | Carey |
| 2010/0013039 A1 | 1/2010 | Qian et al. |
| 2010/0013593 A1 | 1/2010 | Luckhardt |
| 2010/0024871 A1 | 2/2010 | Oh et al. |
| 2010/0032008 A1 | 2/2010 | Adekore |
| 2010/0037952 A1 | 2/2010 | Lin |
| 2010/0038523 A1 | 2/2010 | Venezia et al. |
| 2010/0038542 A1 | 2/2010 | Carey et al. |
| 2010/0040981 A1 | 2/2010 | Kiesel et al. |
| 2010/0044552 A1 | 2/2010 | Chen |
| 2010/0051809 A1 | 3/2010 | Onat et al. |
| 2010/0052088 A1 | 3/2010 | Carey |
| 2010/0053382 A1 | 3/2010 | Kuniba |
| 2010/0055887 A1 | 3/2010 | Piwczyk |
| 2010/0059385 A1 | 3/2010 | Li |
| 2010/0059803 A1 | 3/2010 | Gidon et al. |
| 2010/0072349 A1 | 3/2010 | Veeder |
| 2010/0074396 A1 | 3/2010 | Schmand et al. |
| 2010/0083997 A1 | 4/2010 | Hovel |
| 2010/0084009 A1 | 4/2010 | Carlson et al. |
| 2010/0096718 A1 | 4/2010 | Hynecek et al. |
| 2010/0097609 A1 | 4/2010 | Jaeger et al. |
| 2010/0102206 A1 | 4/2010 | Cazaux et al. |
| 2010/0102366 A1 | 4/2010 | Lee et al. |
| 2010/0108864 A1 | 5/2010 | Ohta et al. |
| 2010/0109060 A1 | 5/2010 | Mao et al. |
| 2010/0116312 A1 | 5/2010 | Peumans et al. |
| 2010/0117181 A1 | 5/2010 | Kim et al. |
| 2010/0118172 A1 | 5/2010 | McCarten et al. |
| 2010/0128161 A1 | 5/2010 | Yamaguchi |
| 2010/0128937 A1 | 5/2010 | Yoo et al. |
| 2010/0133635 A1 | 6/2010 | Lee et al. |
| 2010/0140733 A1 | 6/2010 | Lee et al. |
| 2010/0140768 A1 | 6/2010 | Zafiropoulo |
| 2010/0143744 A1 | 6/2010 | Gupta |
| 2010/0147383 A1 | 6/2010 | Carey et al. |
| 2010/0200658 A1 | 8/2010 | Olmstead et al. |
| 2010/0201834 A1 | 8/2010 | Maruyama et al. |
| 2010/0219506 A1 | 9/2010 | Gupta |
| 2010/0224229 A1 | 9/2010 | Pralle et al. |
| 2010/0240169 A1 | 9/2010 | Petti et al. |
| 2010/0245647 A1 | 9/2010 | Honda et al. |
| 2010/0258176 A1 | 10/2010 | Kang et al. |
| 2010/0264473 A1 | 10/2010 | Adkisson et al. |
| 2010/0289885 A1 | 11/2010 | Lu et al. |
| 2010/0290668 A1 | 11/2010 | Friedman et al. |
| 2010/0300505 A1 | 12/2010 | Chen |
| 2010/0300507 A1 | 12/2010 | Heng et al. |
| 2010/0313932 A1 | 12/2010 | Kroll et al. |
| 2011/0003424 A1 | 1/2011 | De Ceuster et al. |
| 2011/0019050 A1 | 1/2011 | Yamashita |
| 2011/0056544 A1 | 3/2011 | Ji et al. |
| 2011/0073976 A1 | 3/2011 | Vaillant |
| 2011/0095387 A1 | 4/2011 | Carey et al. |
| 2011/0104850 A1 | 5/2011 | Weidman et al. |
| 2011/0127567 A1 | 6/2011 | Seong |
| 2011/0140221 A1 | 6/2011 | Venezia et al. |
| 2011/0194100 A1 | 8/2011 | Thiel et al. |
| 2011/0220971 A1 | 9/2011 | Haddad |
| 2011/0227138 A1 | 9/2011 | Haddad |
| 2011/0241148 A1 | 10/2011 | Hiyama et al. |
| 2011/0241152 A1 | 10/2011 | Hsiao et al. |
| 2011/0251478 A1 | 10/2011 | Wieczorek |
| 2011/0260059 A1 | 10/2011 | Jiang et al. |
| 2011/0266644 A1 | 11/2011 | Yamamura et al. |
| 2011/0292380 A1 | 12/2011 | Bamji |
| 2011/0303999 A1 | 12/2011 | Sakamoto et al. |
| 2012/0024363 A1 | 2/2012 | Carey et al. |
| 2012/0024364 A1 | 2/2012 | Carey, III et al. |
| 2012/0025199 A1 | 2/2012 | Chen et al. |
| 2012/0038811 A1 | 2/2012 | Ellis-monaghan et al. |
| 2012/0043637 A1 | 2/2012 | King et al. |
| 2012/0049242 A1 | 3/2012 | Atanackovic et al. |
| 2012/0049306 A1 | 3/2012 | Ohba et al. |
| 2012/0080733 A1 | 4/2012 | Doan et al. |
| 2012/0111396 A1 | 5/2012 | Saylor et al. |
| 2012/0147241 A1 | 6/2012 | Yamaguchi |
| 2012/0153127 A1 | 6/2012 | Hirigoyen et al. |
| 2012/0153128 A1 | 6/2012 | Roy et al. |
| 2012/0171804 A1 | 7/2012 | Moslehi et al. |
| 2012/0187190 A1 | 7/2012 | Wang et al. |
| 2012/0188431 A1 | 7/2012 | Takimoto |
| 2012/0217602 A1 | 8/2012 | Enomoto |
| 2012/0222396 A1 | 9/2012 | Clemen |
| 2012/0228473 A1 | 9/2012 | Yoshitsugu |
| 2012/0274744 A1 | 11/2012 | Wan |
| 2012/0291859 A1 | 11/2012 | Vineis et al. |
| 2012/0300037 A1 | 11/2012 | Laudo |
| 2012/0305063 A1 | 12/2012 | Moslehi et al. |
| 2012/0312304 A1 | 12/2012 | Lynch et al. |
| 2012/0313204 A1 | 12/2012 | Haddad et al. |
| 2012/0313205 A1 | 12/2012 | Haddad et al. |
| 2012/0326008 A1 | 12/2012 | Mckee et al. |
| 2013/0001553 A1 | 1/2013 | Vineis et al. |
| 2013/0020468 A1 | 1/2013 | Mitsuhashi et al. |
| 2013/0082343 A1 | 4/2013 | Fudaba et al. |
| 2013/0135439 A1 | 5/2013 | Kakuko et al. |
| 2013/0168792 A1 | 7/2013 | Haddad et al. |
| 2013/0168803 A1 | 7/2013 | Haddad et al. |
| 2013/0200251 A1* | 8/2013 | Velichko .......... H01L 31/02327 250/208.1 |
| 2013/0207212 A1 | 8/2013 | Mao et al. |
| 2013/0207214 A1 | 8/2013 | Haddad et al. |
| 2013/0285130 A1 | 10/2013 | Ting |
| 2014/0054662 A1 | 2/2014 | Yanagita et al. |
| 2014/0352779 A1 | 4/2014 | Smirnov et al. |
| 2014/0198240 A1 | 7/2014 | Rhoads |
| 2014/0247378 A1 | 9/2014 | Sharma et al. |
| 2014/0374868 A1 | 12/2014 | Lee et al. |
| 2015/0076468 A1 | 3/2015 | Yamaguchi et al. |
| 2017/0244920 A1 | 8/2017 | Ohkubo et al. |

FOREIGN PATENT DOCUMENTS

| | | |
|---|---|---|
| CN | 101465361 | 6/2009 |
| CN | 101740597 | 6/2010 |
| CN | 201725796 | 1/2011 |
| CN | 101978498 | 2/2011 |
| CN | 102270646 | 12/2011 |
| DE | 19838439 | 4/2000 |

(56) References Cited

FOREIGN PATENT DOCUMENTS

| | | |
|---|---|---|
| EP | 0473439 | 3/1992 |
| EP | 0566156 | 10/1993 |
| EP | 1630871 | 1/2006 |
| EP | 1818855 | 8/2007 |
| EP | 1873840 | 1/2008 |
| EP | 2073270 | 5/2012 |
| EP | 2509107 | 10/2012 |
| FR | 2827707 | 1/2003 |
| GB | 2030766 | 4/1980 |
| JP | S5771188 | 5/1982 |
| JP | S57173966 | 10/1982 |
| JP | S63116421 | 5/1988 |
| JP | H02152226 | 6/1990 |
| JP | H02237026 | 9/1990 |
| JP | H03183037 | 8/1991 |
| JP | H04318970 | 11/1992 |
| JP | H06104414 | 4/1994 |
| JP | H06244444 | 9/1994 |
| JP | H06267868 | 9/1994 |
| JP | H06275641 | 9/1994 |
| JP | 407074240 * | 3/1995 |
| JP | H07183484 | 7/1995 |
| JP | 9148594 | 6/1997 |
| JP | H09298308 | 11/1997 |
| JP | 11077348 | 3/1999 |
| JP | 11097724 | 4/1999 |
| JP | 2000164914 | 6/2000 |
| JP | 2001007381 | 1/2001 |
| JP | 2001189478 | 7/2001 |
| JP | 2001339057 | 12/2001 |
| JP | 2002043594 | 2/2002 |
| JP | 2002134640 | 5/2002 |
| JP | 2003163360 | 6/2003 |
| JP | 2003242125 | 8/2003 |
| JP | 2004273886 | 9/2004 |
| JP | 2004273887 | 9/2004 |
| JP | 2006173381 | 6/2006 |
| JP | 2006255430 | 9/2006 |
| JP | 2007165909 | 6/2007 |
| JP | 2007180642 | 7/2007 |
| JP | 2007180643 | 7/2007 |
| JP | 2007258684 | 10/2007 |
| JP | 2007305675 | 11/2007 |
| JP | 2008187003 | 8/2008 |
| JP | 2008283219 | 11/2008 |
| JP | 2009021479 | 1/2009 |
| JP | 2010278472 | 12/2010 |
| JP | 2011003860 | 1/2011 |
| JP | 2011091128 | 5/2011 |
| JP | 2012054321 | 3/2012 |
| JP | 2012169530 | 9/2012 |
| JP | 2012191005 | 10/2012 |
| KR | 20010061058 | 4/2001 |
| KR | 2005039273 | 4/2005 |
| KR | 20060020400 | 3/2006 |
| KR | 20080014301 | 2/2008 |
| KR | 100825808 | 4/2008 |
| KR | 20080097709 | 11/2008 |
| KR | 20090077274 | 7/2009 |
| KR | 20100118864 | 11/2010 |
| KR | 20110079323 | 7/2011 |
| KR | 20060052278 | 5/2016 |
| KR | 20170070266 | 6/2017 |
| TW | 200627675 | 8/2006 |
| TW | 200818529 | 4/2008 |
| WO | WO 91/14284 | 9/1991 |
| WO | WO200031679 | 6/2000 |
| WO | WO 2002041363 | 5/2002 |
| WO | WO 03/059390 | 7/2003 |
| WO | WO 2006/086014 | 8/2006 |
| WO | WO 2008091242 | 7/2008 |
| WO | WO 2008099524 | 8/2008 |
| WO | WO 2008145097 | 12/2008 |
| WO | WO 2009100023 | 8/2009 |
| WO | 2009147085 | 12/2009 |
| WO | WO 2009147085 | 12/2009 |
| WO | WO 2010033127 | 3/2010 |
| WO | 2011003871 | 1/2011 |
| WO | WO 2011003871 | 1/2011 |
| WO | 2011035188 | 3/2011 |
| WO | 2011119618 | 3/2011 |
| WO | WO 2011035188 | 3/2011 |
| WO | WO 2011119618 | 3/2011 |
| WO | 2012117931 | 9/2012 |
| WO | 2012174752 | 12/2012 |
| WO | 2014110484 | 7/2014 |

OTHER PUBLICATIONS

Asom et al., Interstitial Defect Reactions in Silicon; Appl. Phys. Lett.; Jul. 27, 1987; pp. 256-258; vol. 51(4); American Institute of Physics.

Berger, Michael; Moth Eyes Inspire Self-Cleaning Antireflection Nanotechnology Coatings; 2008; 3 pages; Nanowerk LLC.

Berger, O., Inns, D. and Aberle, A.E. "Commercial White Paint as Back Surface Reflector for Thin-Film Solar Cells", Solar Energy Materials & Solar Cells, vol. 91, pp. 1215-1221,2007.

Betta et al.; Si-PIN X-Ray Detector Technology; Nuclear Instruments and Methods in Physics Research; 1997; pp. 344-348; vol. A, No. 395; Elsevier Science B.V.

Boden, S.A. et al.; Nanoimprinting for Antireflective Moth-Eye Surfaces; 4 pages; 2008.

Bogue: "From bolometers to beetles: the development of the thermal imaging sensors;" sensor Review; 2007; pp. 278-281; Emerald Group Publishing Limited (ISSN 0260-2288).

Borghesi et al.; "Oxygen Precipitation in Silicon," J. Appl. Phys., v. 77(9), pp. 4169-4244 (May 1, 1995).

Born, M. and E.Wolf, "Princip les of Optics, 7th Ed.", Cambridge University Press, 1999, pp. 246-255.

Brieger,S., O.Dubbers, S.Fricker, A.Manzke, C.Pfahler, A.Plettl, and P.Zlemann, "An Approach for the Fabrication of Hexagonally Ordered Arrays of Cylindrical Nanoholes in Crystalline and Amorphous Silicon Based on the Self-Organization of Polymer Micelles", Nanotechnology, vol. 17, pp. 4991-4994, 2006, doi:10.1088/0957-4884/17/19/036.

Buttgen, B.; "Demodulation Pixel Based on Static Drift Fields"; IEEE Transactions on Electron Devices, vol. 53, No. 11, Nov. 2006.

Carey et al., "Femtosecond-Laser-Assisted Microstructuring of Silicon Surfaces", Optics and Photonics News, 2003. 14, 32-36.

Carey, et al. "Femtosecond Laser-Assisted Microstructuring of Silicon for Novel Detector, Sensing and Display Technologies", LEOS 2003, 481-482, Tuscon, AR.

Carey, et al. "Femtosecond Laser-Assisted Microstructuring of Silicon for Novel Detector, Sensing and Display Technologies", LEOS; 2002, 97-98, Glasgos, Scotland, 2002.

Carey, et al., "Fabrication of Micrometer-Sized Conical Field Emitters Using Femtosecond Laser-Assisted Etching of Silicon," Proc. IVMC 2001, 75-76, UC Davis, Davis, CA.

Carey, et al., "Field Emission from Silicon. Microstructures Formed by Femtosecond Laser Assisted Etching," Proc. CLEO 2001 (Baltimore, MD 2001) 555-557.

Carey, et al., "High Sensitivity Silicon-Based VIS/NIR Photodetectors", Optical Society of America (2003) 1-2.

Carey, III; "Femtosecond-laser Microstructuring of Silicon for Novel Optoelectronic Devices"; Harvard University, Jul. 2004; (Thesis).

Chang, S.W., V.P.Chuang, S.T.Boles, and C.V.Thompson, "Metal-Catalyzed Etching of Vertically Aligned Polysilicon and Amorphous Silicon Nanowire Arrays by Etching Direction Confinement", Advanced Functional Materials, vol. 20, No. 24, pp. 4364-4370, 2010.

Chen, Q. et al.; Broadband moth-eye antireflection coatings fabricated by low-cost nanoimprinting; Applied Physics Letters 94; pp. 263118-1-263118-3; 2009; American Institute of Physics.

Chien et al, "Pulse Width Effect in Ultrafast Laser Processing of Materials," Applied Physics A, 2005, 1257-1263, 81, Springer Berlin, Heidelberg, Germany.

(56) References Cited

OTHER PUBLICATIONS

Chiang, Wen Jen Et al., "Silicon Nanocrystal-Based Photosensor on Low-Temperature Polycrystalline-Silicone Panels", Applied Physics Letters, 2007, 51120-1-51120-3, Ltt. 91, American Inst. Of Physics, Melville, NY.
Chichkiv, B.N. et al, "Femtosecond, picosecond and nanosecond laser ablation of solids" Appl. Phys. A 63, 109-115; 1996.
Cilingiroglu et al., "An evaluation of MOS Interface-Trap Charge Pump as and Ultralow Constant-Current Generator," IEEE Journal of Solid-State Circuit, 2003, vol. 38, No. 1, Jan. 2003, 71-83.
CMOSIS; "Global Shutter Image Sensors for Machine Vision Application"; Image Sensors Europe 2010, Mar. 23-25, 2010; .COPYRGT. copyright 2010.
Cotter, Jeffrey E.; Optical intensity of light in layers of silicon with rear diffuse reflectors; Journal of Applied Physics; Jul. 1, 1998; pp. 618-624; vol. 84, No. 1; American Institute of Physics.
Crouch et al., "Comparison of Structure and Properties of Femtosecond and Nanosecond Laser-Structured Silicon" Appl. Phys. Lett., 2004, 84,1850-1852.
Crouch et al., "Infrared Absorption by Sulfur-Doped Silicon Formed by Femtosecond Laser Irradiation", Appl. Phys. A, 2004, 79, 1635-1641.
Despeisse, et al.; "Thin Film Silicon Solar Cell on Highly Textured Substrates for High Conversion Efficiency"; 2004.
Detection of X-ray and Gamma-ray Photons Using Silicon Diodes; Dec. 2000; Detection Technology, Inc.; Micropolis, Finland.
Dewan, Rahul et al.; Light Trapping in Thin-Film Silicon Solar Cells with Submicron Surface Texture; Optics Express; vol. 17, No. 25; Dec. 7, 2009; Optical Society of America.
Deych et al.; Advances in Computed Tomography and Digital Mammography; Power Point; Nov. 18, 2008; Analogic Corp.; Peabody, MA.
Dobie, et al.; "Minimization of reflected light in photovoltaic modules"; Mar. 1, 2009.
Dobrzanski, L.A. et al.; Laser Surface Treatment of Multicrystalline Silicon for Enhancing Optical Properties; Journal of Materials Processing Technology; p. 291-296; 2007; Elsevier B.V.
Dolgaev et al., "Formation of Conical Microstructures Upon Laser Evaporation of Solids", Appl. Phys. A, 2001, 73, 177-181.
Duerinckx, et al.; "Optical Path Length Enhancement for >13% Screenprinted Thin Film Silicon Solar Cells"; 2006.
Dulinski, Wojciech et al.; Tests of backside illumincated monolithic CMOS pixel sensor in an HPD set-up; Nuclear Instruments and methods in Physics Research; Apr. 19, 2005; pp. 274-280; Elsevier B.V.
Forbes; "Texturing, reflectivity, diffuse scattering and light trapping in silicon solar cells"; 2012.
Forbes, L. and M.Y. Louie, "Backside Nanoscale Texturing to Improve IR Response of Silicon Photodetectors and Solar Cells," Nanotech, vol. 2, pp. 9-12, Jun. 2010.
Fowlkes et al., "Surface Microstructuring and Long-Range Ordering of Silicon Nanoparticles", Appl. Phys. Lett., 2002, 80 (20), 3799-3801.
Gjessing, J. et al.; 2D back-side diffraction grating for impored light trapping in thin silicon solar cells; Optics Express; vol. 18, No. 6; pp. 5481-5495; Mar. 15, 2010; Optical Society of America.
Gjessing, J. et al.; 2D blazed grating for light trapping in thin silicon solar cells; 3 pages; 2010; Optical Society of America.
Gloeckler et al. Band-Gap Grading in CU(In,GA)Se2 Solar Cells, Journal of Physics and Chemistry of Solids; 2005; pp. 189-194; vol. 66.
Goetzberger, et al.; "Solar Energy Materials & Solar Cells"; vol. 92 (2008) pp. 1570-1578.
Han et al., "Evaluation of a Small Negative Transfer Gate Bias on the Performance of 4T CMOS Image Sensor Pixels," 2007 International Image Sensor Workshop, 238-240, Ogunquit, Maine.
Haug, et al.; "Light Trapping effects in thin film silicon solar cells"; 2009.
Her et al., "Microstructuring of Silicon with Femtosecond Laser Pulses," Applied Physics Letters, 1998, 1673-1675, vol. 73, No. 12, American Institute of Physics.
Her et al., "Novel Conical Microstructures Created in Silicon With Femtosecond Laser Pulses", CLEO 1998, 511-512, San Francisco, CA.
Her, et al., "Femtosecond laser-induced formation of spikes on silicon," Applied Physics A, 2000, 70, 383-385.
Hermann, S. et al.; Impact of Surface Topography and Laser Pulse Duration for Laser Ablation of Solar Cell Front Side Passivating SiNx Layers; Journal of Applied Physics; vol. 108, No. 11; pp. 114514-1-114514-8; 2010; American Institute of Physics.
High-Performance Technologies for Advanced Biomedical Applications; .COPYRGT. 2004Brochure; pp. 1-46; PerkinElmerOptoelectronics.
Holland; Fabrication of Detectors and Transistors on High-Resistivity Silicon; Nuclear Instruments and Methods in Physics Research, vol. A275, pp. 537-541 (1989).
Hong et al., "Cryogenic processed metal-semiconductor-metal (MSM) photodetectors on MBE grown ZnSe,", 1999, IEEE Transactions on Electron Devices, vol. 46, No. 6, pp. 1127-1134.
Hsieh et al., "Focal-Plane-Arrays and CMOS Readout Techniques of Infrared Imaging Systems," IEE Transactions on Circuits and Systems for Video Technology, 1997, vol. 7, No. 4, Aug. 1997, 594-605.
Hu et al., "Solar Cells from Basic to Advanced Systems," McGraw Hill Book Co., 1983, 39, New York, New York.
Huang, et al.; "Microstructured silicon photodetector"; Applied Physics Letters 89, 033506; 2006 American Institute of Physics; 2006.
Hüpkes, J. et al.; Light Scattering and Trapping in Different Thin Film Photovoltaic Devices; 24th European Photovoltaic Solar Energy Conference, Hamburg, Germany (Sep. 21-25, 2009); pp. 2766-2769.
Igalson et al. Defect States in the CIGS Solar cells by Photocapacitance and Deep Level Optical Spectroscopy; Bulletin of the Polish Academy of Sciences Technical Sciences; 2005; pp. 157-161; vol. 53(2).
"Infrared Absorption by Sulfur-Doped Silicon formed by Femtosecond Laser Irradiation"; Springer Berline/Heidelberg, vol. 79, Nov. 2004.
Job et al., "Doping of Oxidized Float Zone Silincon by Thermal Donors—A low Thermal Budget Doping Method for Device Applications?" Mat. Res. Soc. Symp. Pro.; v. 719, F9.5.1-F9.5.6 (2002).
Joy, T. et al.; Development of a Production-Ready, Back-Illuminated CMOS Image Sensor with Small Pixels; Electron Devices Meeting; pp. 1007-1010; 2007; IEEE.
Juntunen et al.; Advanced Photodiode Detector for Medical CT Imaging: Design and Performance; 2007; pp. 2730-2735; IEEE.
Kim et al.; "Strong Sub-Band-Gap Infrared Absorption in Silicon Supersaturated with Sulfur"; 2006 Appl. Phys. Lett. 88, 241902-1-241902-3.
Kolasinski et al., "Laser Assisted and Wet Chemical Etching of Silicon Nanostructures," J. Vac. Sci. Technol., A 24(4), Jul./Aug. 2006, 1474-1479.
Konstantatos et al., "Engineering the Temproal Response of Photoconductive Photodetectors via Selective Introduction of Surface Trap States," Nano Letters, v. 8(5), pp. 1446-1450 (Apr. 2, 2008).
Konstantatos et al., "PbS Colloidal Quantum Dot Photoconductive Photodetectors: Transport, Traps, and Gain," Appl. Phys. Lett., v. 91, pp. 173505-1-173505-3 (Oct. 23, 2007).
Kray, D. et al.; Laser-doped Silicon Soalr Cells by Laser Chemical Processing (LCP) exceeding 20% Efficiency; 33rd IEEE Photovoltaic Specialist Conference; 3 pages; May 2008; IEEE.
Kroning et al.; X-ray Imaging Systems for NDT and General Applications; 2002; Fraunhofer Institute for Nondestructive Testing; Saarbrucken and Dresden, Germany.
Kryski; A High Speed 4 Megapixel Digital CMOS Sensor; 2007 International Image Sensor Workshop; Jun. 6-10, 2007.
Li, "Design and Simulation of an Uncooled Double-Cantilever Microbolometer with the Potential for .about.mK NETD," 2004, Sensors and Actuators A, 351-359, vol. 112, Elsevier B.V.

(56) References Cited

OTHER PUBLICATIONS

Li et al., "Gettering in High Resistive Float Zone Silicon Wafers," Transaction on Nuclear Science, vol. 36(1), pp. 290-294 (Feb. 1, 1989).

Li, Hongsong et al.; An experimental study of the correlation between surface roughness and light scattering for rough metallic surfaces; Advanced Characterization Techniques for Optics, Semiconductors, and Nanotechnologies II; 2005; pp. 25780V-1-25780V-15; vol. 5878; SPIE Bellingham, WA.

Lin, A. et al.; Optimization of Random Diffraction Gratings in Thin-Film Solar Cells Using Genetic Algorithms; 2007; 1 page; SSEL Annual Report.

Low Dose Technologies; Power Point.

Madzharov, et al.; "Light trapping in thin-firm silicon solar cells for superstrate and substrate configuration" Abstract #1614, 218.sup.th ECS Meeting .COPYRGT. 2010 the Electrochemical Society.

"Masimo Rainbow SET Pulse CO-Oximetry," 2010, Masimo Corporation, Irvine, California, http://www.masimo.com/Rainbow/about.htm.

Mateus; C.F.R. et al.; Ultrabroadband Mirror Using Low-Index Cladded Subwavelength Grating; Photonics Technology Letters; vol. 16, Issue No. 2; pp. 518-520; Feb. 2004; IEEE.

Matsuno, Shigeru et al.; Advanced Technologies for High Efficiency Photovoltaic Systems; Mitsubishi Electric Advance; vol. 122; pp. 17-19; Jun. 2008.

Meynants, et al.; "Backside illuminated global shutter COMOS image sensors"; 2011 International Image Sensor Workshop; Jun. 11, 2011.

Moloney, A.M. et al.; Novel Black Silicon PIN Photodiodes; 8 pages; Jan. 25, 2006; SPIE.

Moon et al. Selective emitter using porous silicon for crystalline silicon solar cells. Solar Energy Materials & Solar Cells, v. 93, pp. 846-850 (2009).

Moses; Nuclear Medical Imaging—Techniques and Challenges; Power Point; Feb. 9, 2005; Lawrence Berkeley National Laboratory Department of Functional Imaging.

Murkin, JM and Arangol, M, "Near Infrared spectroscopy as an index of rain and tissue oxygenation," Bri. J. Of Anathesia (BJA/PGA Supplement):13-i13 (2009).

Munday, J.N. et al.; Large Integrated Absorption Enhancement in Plasmonic Solar Cells by Combining Metallic Gratings and Antireflection Coatings; Nano Letters; vol. 11, No. 6; pp. 2195-2201; Oct. 14, 2010; American Chemical Society.

Myers, Richard et al., "Enhancing Near-IR Avalanche Photodiodes Performance by Femtosecond Laser Microstructuring" Harvard Dept. Of Physics.

Nauka et al., Intrinsic Gettering in Oxygen-Free Silicon; App. Phys. Lett., vol. 46(7), Apr. 4, 1985.

Nauka et al., "New Intrinsic Gettering Process in Silicon Based on Interactions of Silicon Interstitials," J. App. Phys., vol. 60(2), pp. 615-621, Jul. 15, 1986.

Nayak et al, "Semiconductor Laesr Crystallization of a—Si:H," SPIE Digital Library, 2003, 277-380, vol. 4977, Bellingham, Washington. 2003.

Nayak et al, "Ultrafast-Laser-Assisted Chemical Restructuring of Silicon and Germanium Surfaces," Applied Surface Science, 2007, 6580-6583, vol. 253, Issue 15, Elsevier B.V.

Nayak et al, "Semiconductor Laser Crystallization of a—Si:H on Conducting Tin-Oxide-Coated Glass for Solar Cell and Display Applications," Applied Physics A, 2005, 1077-1080, 80, Springer Berlin, Heidelberg, Germany.

Nayak, B.K. et al.; Ultrafast Laser Textured Silicon Solar Cells; Mater. Res. Soc. Symp. Proc.; vol. 1123; 6 pages; 2009; Materials Research Society.

Nayak, et al.; "Efficient light trapping in silicon solar cells by ultrafast-laser-induced self-assembled micro/nano structures"; Progress in Photovoltaics: Research and Applications; 2011.

Oden, et al.; "Optical and Infrared Detection Using Microcantilevers;" SPIE Digital Library on Oct. 13, 2010; vol. 2744; 10 pages.

Pain, Bedabrata; Backside Illumination Technology for SOI-CMOS Image Sensors; 2009 IISW Symposium on Backside Illujination of Solid-State Image Sensors, Bergen Norway; Jun. 25, 2009; pp. 1-23.

Pain, Bedabrata; "A Back-Illuminated Megapixel CMOS Image Sensor"; http://hdl.handle.net/2014/39323; May 1, 2005.

Palm et al. CIGSSe Thin Film PB Modules: From Fundamental Investigators to Advanced Performance and Stability; Thin Solid Films; 2004; pp. 544-551; vol. 451-2.

Payne, D.N.R. et al.; Characterization of Experimental Textured ZnO:Al Films for Thin Film Solar Cell Applications and Comparison with Commercial and Plasmonic Alternatives; Photovoltaic Specialists Conference (PVSC); pp. 1560-1564; 2010; IEEE.

Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.

Pedraza et al., "Surface Nanostructuring of Silicon", Appl. Phys. A, 2003, 77, 277-284.

Rashkeev et al., "Hydrogen passivation and Activation of Oxygen Complexes in Silicon," American Institute of Physics, vol. 78(11), pp. 1571-1573 (Mar. 12, 2001).

Russell, et al.; "Nanosecond Eximer Laser Processing for Novel Microelectronic Fabrication"; Nanosecond Excimer Laser Processing; 6 pages; 1989.

Russell, Ramirez and Kelley, "Nanosecond Excimer Laser Processing for Novel Microelectronic Devices," US Navy, SPAWAR, San Diego, Techical Report, 2003.

Russell, Ramirez, Kelley, "Nanosecond Excimer Laser Processing for Novel Microelectronic Fabrication," SSC Pacific Technical Reports , pp. 228-233, 2003, vol. 4, US Navy.

Sai, H. et al.; Enhancement of Light Trapping in Thin-Film Hydrogenated Microcrystalline Si Solar Cells Using Back Reflectors with Self-Ordered Dimple Pattern; Applied Physics Letters; vol. 93; 2008; American Institute of Physics.

Sanchez et al., "Whiskerlike Structure Growth on Silicon Exposed to ArF Excimer Laser Irradiation", Appl. Phys. Lett., 1996, 69 (5), 620-622.

Sanchez et al., "Dynamics of the Hydrodynamical Growth of Columns on Silicon Exposed to ArF Excimer-Laser Irradiation ", Appl. Phys. A, 66, 83-86 (1998).

Sarnet et al.; "Femtosecond laser for black silicon and photovoltaic cells"; Feb. 21, 2008, Proc. Of SPIE; vol. 6881; pags 1-15.

Senoussaoui, N. et al.; Thin-Film Solar Cells with Periodic Grating Coupler; Thin Solid Films; pp. 397-401; 2003; Elsevier B.V.

Serpenguzel et al., "Temperature Dependence of Photluminescence in Non-Crystalline Silicon", Photonics West (San Jose, CA, 2004) 454-462.

Shen et al., "Formation of Regular Arrays of Silicon Micorspikes by Femotsecond Laser Irradiation Through a Mask", Appl. Phys. Lett., 82, 1715-1717 (2003).

Solar Energy Research Institute, "Basic Photovoltaic Principles and Methods," Van Nostrand Reinhold Co., NY 1984, pp. 45-47 and 138-142.

Solhusvik, J. et al. "A 1280x960 3.75um pixel CMOS imager with Triple Exposure HDR," Proc. of 2009 International Image Sensor Workshop, Bergen, Norway, Jun. 22-28, 2009.

Stone et al.; The X-ray Sensitivity of Amorphous Selenium for Mammography;.Am. Assoc. Phys. Med.; Mar. 2002; pp. 319-324; vol. 29 No. 3; Am. Assoc. Phys. Med.

Szlufcik, J. et al.; Simple Integral Screenprinting process for selective emitter polycrystalline silicon solar cells; Applied Physics Letters; vol. 59, No. 13; Sep. 23, 1991; American Institute of Physics.

Tabbal et al., "Formation of Single Crystal Sulfur Supersaturated Silicon Based Junctions by Pulsed Laser Melting". 2007, J. Vac. Sci. Technol. B25(6), 1847-1852.

Takayanagi, et al.; "A 600.times.600 Pixel, 500, fps CMOS Image Sensor with a 4.4 jum Pinned Photodiode 5-Transistor Global Shutter Pixel"; 2007 International Image Sensor Workshop; Jun. 6-10, 2007.

Tower, John R. et al.; Large Format Backside Illuminated CCD Imager for Space Surveillance; IEEE Transactions on Electron Devices, vol. 50, No. 1; Jan. 2003; pp. 218-224.

(56) References Cited

OTHER PUBLICATIONS

Tull; "Femtosecond Laser Ablation of Silicon: Nanoparticles, Doping and Photovotaics"; Harvard University, Jun. 2007 (Thesis).
Uehara et al., "A High-Sensitive Digital Photosensor Using MOS Interface-Trap Charge Pumping," IEICE Electronics Express, 2004, vol. 1, No. 18, 556-561.
Wilson, "Depth Distributions of Sulfur Implanted Into Silicon as a Function of Ion energy, Ion Fluence, and Anneal Temperature," 1984, Appl. Phys. 55(10, 3490-3494.
Winderbaum, S. et al.; Reactive ion etching (RIE) as a method for texturing polycrystalline silicon solar cells; Solar Energy Materials and Solar Cells; 1997; pp. 239-248; Elsevier Science B.V.
Wu et al., "Black Silicon" Harvard UPS 1999.
Wu et al., "Black Silicon: A New Light Absorber," APS Centennial Meeting (Mar. 23, 1999).
Wu et al., "Femtosecond laser-gas-solid interactions," Thesis presented to the Department of Physics at Harvard University, pp. 1-113, 126-136, Aug. 2000.
Wu et al., "Visible Luminescence From Silicon Surfaces Microstructured in Air". Appl. Phys. Lett., vol. 81, No. 11, 1999-2001 (2002).
Wu, et al "Near-Unity Below-Band-Gap Absorption by Microstructured Silicon," 2001, Applied Physics Letters, 1850-1852, vol. 78, No. 13, American Institute of Physics.
Xu, Y., et al, "Infrared Detection Using Thermally Isolated Diode," Sensors and Actuators A, Elsevier Sequoia S.A., 1993, vol. 36, 209-217, Lausanne, Switzerland.
Yablonovitch, et al.; "Intensity Enhancement in Textured Optical Sheets for Solar Cells"; .COPYRGT. 1982 IEEE.
Yamamoto, K. et al.; NIR Sensitivity Enhancement by Laser Treatment for Si Detectors; Nuclear Instruments and Methods in Physics Research A; pp. 520-523; Mar. 31, 2010; Elsevier.
Yan, B.; Light Trapping Effect from Randomized Textures of Ag/ZnO Back Reflector on Hyrdrogenated Amorphous and Nanocrystalline Silicon Based Solar Cells; Thin Film Solar Technology II; vol. 7771; 2010; SPIE.
Yasutomi, et al.; "Two-Stage Charge Transfer Pixel Using Pinned Diodes for Low-Noise Global Shutter Imaging"; 2009 International Image Sensor Workshop; Mar. 28, 2009.
Younkin et al., "Infrared Absorption by Conical Silicon Microstructures Made in a Variety of Background Gases Using Femtosecond-Laser Pulses", J. Appl. Phys., 93, 2626-2629 (2003).
Younkin, "Surface Studies and Microstructure Fabrication Using Femtosecond Laser Pulses,"Thesis presented to the Division of Engineering & Applied sciences at Harvard University (Aug. 2001).
Yuan, et al.; "Efficient black silicon solar cell with a density-graded nanoporous surface: Optical properties, performance limitations, and design rules"; American Institute of Physics; Applied Physics Letters 95. 1230501 (2009) 3 pages.
Zaidi, S.H. et al.; Diffraction Grating Structures in Solar Cells; Photovoltaic Specialists Conference, 2000; 4 pages; Sep. 2000; IEEE.
Zhang et al, "Ultra-Shallow P+-Junction Formation in Silicon by Excimer Laser Doping: a Heat and Mass Transfer Perspective," Int. J. Heat Mass Transfer, 1996, 3835-3844, vol. 39, No. 18, Elsevier Science Ltd., Great Britain.
Zhu et al., "Evolution of Silicon Surface Microstructures by Picosecond and Femtosecond Laser Irradiations," Applied Surface Science, 2005, 102-108, Elsevie, Amsterdam, NL.Ultra-Shallow P+-Junction Formation in Silicon by Excimer Laser Doping: a Heat and Mass Transfer Perspective, Int. J. Heat Mass Transfer, 1996, 3835-3844, vol. 39, No. 18, Elsevier Science Ltd., Great Britain.
Bernhard, C.G., "Structural and Functional Adaptation in a Visual System" Endevor vol. 26, May 1967. pp. 79-84.
Clapham, P.B. et al, "Reduction of Lens Reflexion by the Moth Eye Principle" Nature, vol. 244. Aug. 1973, pp. 281-282.
Huang, et al.; "Key Technique for texturing a uniform pyramid structure with a layer of silicon nitride on monocrystalline silicon wafer" Applied Surface Science; 2013 pp. 245-249.
Jansen, H. et al., "The Black Silicon Method: a universal method for determining the parameter setting of a flourine-based reactive ion etcher in deep silicon trench etching with profile control",J. Micromech. Microeng. vol. 5, 1995 pp. 115-120.
Koh et al., "Simple nanostructuring on silicon surface by means of focused beam patterning and wet etching", Applied Surface Science, 2000 pp. 599-603.
Zhong, S. et al. "Excellent Light Trapping in Ultra-thin Solar Cells," AFM-Journal, May 2016 pp. 1-11.
Carey, P.G. et al., "In-situ Doping of Silicon Using Gas Immersion Laser Doping (GILD) Process," Appl. Surf. Sci. 43, 325-332 (1989).
Gibbons, J., "Ion Implantation in Semiconductors—Part II; Damage Production and Annealing", proceedings of the IEEE vol. 60, No. 9 pp. 1062-1096. Jun. 1972.
Ziou et al., "Depth from defocus using the hermite transform", Image Processing, 1998. ICIP 98. Intl. Conference on Chicago, IL. Oct. 1998 pp. 958-962.
Campbell, Stephen A., "The Science and Engineering of Microeletronic Fabrication, 2nd Ed.", Oxford University Press, 2001, pp. 406-411.
Ohring, Milton."The Materials of Science of Thin Films"; pp. 176-179; Academic Press, 1992.
Byung Jun Park et al, Jpn. J. Appl. Phys. 46 2454, 2007, 5 pages.
Choubey et al., On Evolution of CMOS Image Sensors, Proceedings of the 8th International Conference on Sensing Technology, Sep. 2-4, 2014, Liverpool, UK, pages.
Fontaine, Ray, A Survey of Enabling Technologies in Successful Consumer Digital Imaging Products (Part 3: Pixel Isolation Structures), http://www.techinsights.com,Jul. 24, 2017, 13 pages.
IMEC, 3D Integrated Image Sensors for Smart Imaging Systems, Piet De Moor, 2010, 32 pages.
Korean Intellectual Property Office (KIPO), CMOS Image Sensor, KIPO, 2004, 29 pages.
Munck, Generic building blocks for 3D integration and their application on hybrid CMOS image sensors, Katholieke Universiteit Leuven, Kapeldreef 75—B-3001 Heverlee, Sep. 2008, 328 pages.
Rao, et al., Monolithic and Fully-Hybrid Backside Illuminated CMOS Imagers for Smart Sensing, IMEC, Kapeldreef 75, B-3001 Leuven, Belgium, 4 pages.
STMicroelctronics, BSI—technical challenges, IISW-2009, Bergen. Jun. 25, 2009, 37 pages.
https://blogs.yahoo.co.jp/miyabiman_now/25628945.html.
Agranov, et al., Pixel continues to shrink . . . Small Pixels for Novel CMOS Image Sensors, 4 pages.
Fontaine, A Review of the 1.4 µm Pixel Generation, Technology Analysis Group Chipworks Inc., 2011 4 pages.
Lee et al., SNR Performance Comparison of 1.4µm Pixel : FSI, Light-guide, and BSI, 2011, 3 pages.
Tournier, et al., Pixel-to-Pixel isolation by Deep Trench technology, STMicroelectronics, 850, rue Jean Monnet—F-38926 Crolles Cedex—France, 2011, 4 pages.
Tournier, et al., Pixel-to-Pixel isolation by Deep Trench technology: Application to CMOS Image Sensor, https://www.researchgate.net/publication/268300742, 2011, 5 pages.
B.J. Park et al., "Deep Trench Isolation for Crosstalk Suppression in Active Pixel Sensors with 1.7µm Pixel Pitch", in Japanese Journal of Applied Physics, vol. 46, No. 4B, pp. 2454-5457, 2007.
D. N. Yaung et al., "High performance 300mm backside illumination technology for continuous pixel shrinkage," 2011 International Electron Devices Meeting, Washington, DC, 2011, pp. 8.2.1-8.2.4.
http://electroiq.com/insights-from-leading-edge/2016/09/iftle-303-sony-introduces-ziptronix-dbi-technology-in-samsung-galaxy-s7, "Omnivision was the first to sample BSI in 2007 but costs were too high and adoption was thus very low", (2016).
http://joseph-tang.blogspot.com/2017/, Oshiyama et al. , Near-infrared Sensitivity Enhancement of a Back-Illuminated Complementary Metal Oxide Semiconductor Image Sensor with a Pyramid Surface for Diffraction Structure,(2017).
K. Itonaga et al., "Extremely-low-noise CMOS Image Sensor with high saturation capacity," 2011 International Electron Devices Meeting, Washington, DC, 2011, pp. 8.1.1-8.1.4.
K. Minoglou et al., "Reduction of Electrical Crosstalk in Hybrid Backside Illuminated CMOS Imagers using Deep Trench Isolation," 2008 International Interconnect Technology Conference, Burlingame, CA, USA, 2008, pp. 129-131.

(56) References Cited

OTHER PUBLICATIONS

Y. Kitamura et al., "Suppression of crosstalk by using backside deep trench isolation for 1.12μm backside illuminated CMOS image sensor," 2012 International Electron Devices Meeting, San Francisco, CA, 2012, pp. 24.2.1-24.2.4.

* cited by examiner

PIXEL ISOLATION ELEMENTS, DEVICES AND ASSOCIATED METHODS

PRIORITY DATA

The present application claims priority as a continuation application to U.S. patent application Ser. No. 14/747,875 filed on Jun. 26, 2015, which is a continuation of U.S. patent application Ser. No. 13/841,120, filed on Mar. 15, 2013, which claims the benefit of U.S. Provisional Patent Application Ser. No. 61/614,275, filed on Mar. 22, 2012, all of which are incorporated herein by reference.

BACKGROUND

Image sensors are typically formed on various forms of semiconductor materials such as, for example, silicon. Imagers can be incorporated into a variety of devices, including digital cameras, camcorders, computers, cell phones, etc. Due to the ever decreasing size (foot print) of these devices, image sensors have correspondingly seen a decrease in size. Backside illuminated (BSI) image sensors have increased in importance due to the small size of these imagers as compared to front side illuminated (FSI) image sensors. However, pixel size reduction can lead to a significant sacrifice in image quality. As pixel sizes continue to decrease, image signal to noise tends to decrease while electrical and optical cross-talk between adjacent sensor pixels tends to increase. Traditional attempts to reduce the impact of these effects have included adding microlenses above each image sensor in front side pixel sensors to focus the light on the active detector regions, thereby increasing efficiency and reducing cross-talk. Backside illuminated pixel sensors can present different design considerations. For example, significant cross-talk can be generated due to reflection off the often planar back surface of the device.

SUMMARY

The present disclosure provides for light trapping pixels, devices incorporating such pixels, photovoltaic solar cells, and other optoelectronic devices, including various associated methods. In one aspect, for example, a light trapping device can include at least one light sensitive pixel having a light incident surface, a backside surface opposite the light incident surface, and a peripheral sidewall disposed into at least a portion of the pixel and extending at least substantially around the pixel periphery. The pixel can also include a backside light trapping material substantially covering the backside surface and a peripheral light trapping material substantially covering the peripheral sidewall. The light contacting the backside light trapping material or the peripheral light trapping material is thus reflected back toward the pixel. In another aspect, the present disclosure additionally provides an array of light trapping pixels.

A variety of light trapping materials can be utilized and are contemplated, and any such material capable of being used to trap light in a pixel is considered to be within the present scope. In one aspect, at least one of the backside light trapping material and the peripheral light trapping material can include a high refractive index material sandwiched between two low refractive index materials. In another aspect, the backside light trapping material and the peripheral light trapping material includes a high refractive index material sandwiched between two low refractive index materials. It is contemplated that the two low refractive index materials have a refractive index of less than about 2.1. Non-limiting examples of low refractive index material can include nitrides, oxynitrides, gasses, at least a partial vacuum, and the like, including appropriate combinations thereof. Other non-limiting examples of low refractive index materials can include silicon oxide, silicon nitride, silicon dioxide, and the like. Furthermore, in another aspect a light trapping material can include a higher refractive index material sandwiched between two materials having a refractive index that is at least 0.2 lower as compared to the higher refractive index material. In this case, the materials are not limited by the definition of low vs. high refractive index outlined above, but are rather defined by the relative difference in refractive index.

Furthermore, it is contemplated that high refractive index materials have a refractive index of greater than or equal to about 2.1. Non-limiting examples of high refractive index material can include polycrystalline silicon, amorphous silicon, single crystal silicon, multicrystalline silicon, nanocrystalline silicon, germanium, and the like, including appropriate combinations thereof.

In one aspect, the peripheral sidewall can extend completely around the pixel periphery. In another aspect, the peripheral sidewall can extend from the light incident surface towards the backside surface.

In some aspects it is also contemplated that the light incident surface can include a frontside light trapping material at least partially covering the surface thereof. In one aspect, the frontside light trapping material can be an antireflective layer coating. In another aspect, the frontside light trapping material can be a reflective layer having an aperture to allow entry of light into the pixel, wherein the reflective layer is operable to reflect light impinging thereupon from inside the pixel back into the pixel. In some aspects it can be beneficial to include a lens functionally coupled to the aperture and operable to focus incident light through the aperture and into the pixel.

In another aspect the present disclosure additionally provides a substantially light trapping pixel device including a light sensitive pixel having a light incident surface, a backside surface opposite the light incident surface, and a peripheral sidewall extending from the light incident surface to the backside surface and extending around the pixel periphery. The pixel additionally includes a backside light trapping material substantially covering the backside surface, and a peripheral light trapping material substantially covering the peripheral sidewall. Furthermore, an internally reflective frontside light trapping material can cover at least a portion of the light incident surface that is operable to allow entrance of light into the pixel and is operable to reflect light impinging thereupon from inside the pixel back into the pixel, and the light contacting the backside light trapping material or the peripheral light trapping material is reflected back toward the pixel.

In yet another aspect, the present disclosure provides a method of making a light trapping device, including forming at least one pixel by forming a backside light trapping material on a semiconductor layer, the backside light trapping material including a high refractive index material sandwiched between two low refractive index materials, and forming a pixel device layer on the semiconductor layer opposite the light trapping material. The method can additionally include etching a trench circumscribing the pixel device layer and filling the trench with a light trapping material. In some aspects, the trench can be etched to a depth that contacts at least the first low refractive index material. In some aspects, an incident light trapping material can be applied to the pixel device layer. It is also noted that the light trapping material can be located anywhere in the backside region of the device, and that the current scope is not limited to the location of materials or the manufacturing method described above.

In another aspect, filling the trench with the light trapping material can further include depositing a low refractive index material into the trench to fill a portion of the trench from the trench walls inward, ceasing deposition of the low refractive index material to leave an internal space within the trench, and depositing a high refractive index material into the trench to fill the internal space.

In another aspect, the method can include forming a textured region on at least a portion of the semiconductor layer between the semiconductor layer and the first low refractive index prior to depositing the first low refractive index material onto the semiconductor layer. Non-limiting examples of techniques for forming the textured region include plasma etching, reactive ion etching, porous silicon etching, lasing, chemical etching, nanoimprinting, material deposition, selective epitaxial growth, the like, including appropriate combinations thereof. In one specific aspect, forming the textured region includes laser texturing.

BRIEF DESCRIPTION OF THE DRAWINGS

For a further understanding of the nature and advantage of the present disclosure, reference is being made to the following detailed description of embodiments and in connection with the accompanying drawings, in which.

DETAILED DESCRIPTION

Figure 1:
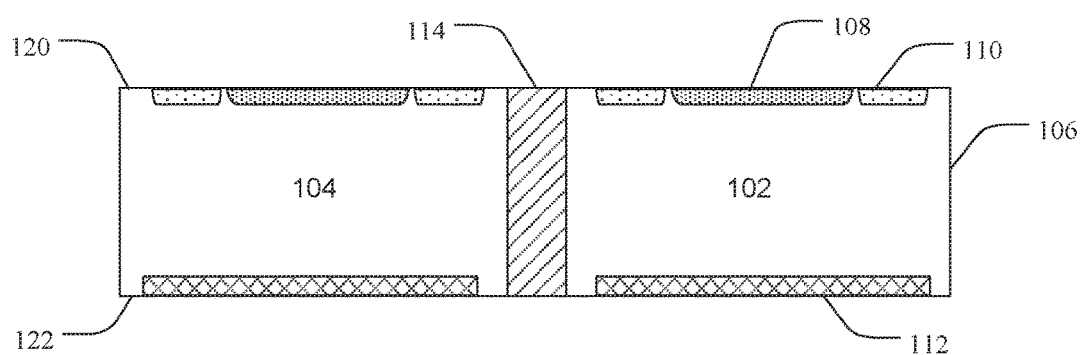
FIG. 1 is a cross-sectional view of multiple image sensor pixels in accordance with an embodiment of the present disclosure.

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

Definitions

The following terminology will be used in accordance with the definitions set forth below.

It should be noted that, as used in this specification and the appended claims, the singular forms "a," and, "the" include plural referents unless the context clearly dictates otherwise. Thus, for example, reference to "a dopant" includes one or more of such dopants and reference to "the layer" includes reference to one or more of such layers.

As used herein, the terms "light" and "electromagnetic radiation" can be used interchangeably and can refer to electromagnetic radiation in the ultraviolet, visible, near infrared and infrared spectra. The terms can further more broadly include electromagnetic radiation such as radio waves, microwaves, x-rays, and gamma rays. Thus, the term "light" is not limited to electromagnetic radiation in the visible spectrum. Many examples of light described herein refer specifically to electromagnetic radiation in the visible and infrared (and/or near infrared) spectra. For purposes of this disclosure, visible range wavelengths are considered to be from approximately 350 nm to 800 nm and non-visible wavelengths are considered to be longer than about 800 nm or shorter than about 350 nm. Furthermore, the infrared spectrum is considered to include a near infrared portion of the spectrum including wavelengths of approximately 800 to 1100 nm, a short wave infrared portion of the spectrum including wavelengths of approximately 1100 nm to 3 micrometers, and a mid-to-long wavelength infrared (or thermal infrared) portion of the spectrum including wavelengths greater than about 3 micrometers up to about 30 micrometers. These are generally and collectively referred to herein as "infrared" portions of the electromagnetic spectrum unless otherwise noted.

As used herein, "quantum efficiency" (QE) is typically referring to "external quantum efficiency" (EQE) which is defined as the ratio of electrons collected per photons incident on an optoelectronic device. "Internal quantum efficiency" is defined as the ratio of electrons collected per photons absorbed by an optoelectronic device.

As used herein, the terms "3D" and "three dimensional" can be used interchangeably, and refer to obtaining distance information using electromagnetic radiation.

As used herein, the terms "disordered surface" and "textured surface" can be used interchangeably, and refer to a surface having a topology with nano- to micron-sized surface variations. Such a surface topology can be formed by the irradiation of a laser pulse or laser pulses, chemical etching, wet or dry etching including masked or maskless etching, lithographic patterning, interference of multiple simultaneous laser pulses, reactive ion etching, plasma etching or any other technique that can be used to form such a topology. While the characteristics of such a surface can be variable depending on the materials and techniques employed, in one aspect such a surface can be several hundred nanometers thick and made up of nanocrystallites (e.g. from about 10 to about 50 nanometers), nanopores, and the like. In another aspect, such a surface can include micron-sized structures (e.g. about 1 μm to about 60 μm). In yet another aspect, the surface can include nano-sized and/or micron-sized structures from about 5 nm and about 500 μm. A variety of criteria can be utilized to measure the size of such structures. For example, for cone-like structures the above ranges are intended to be measured from the peak of a structure to the valley formed between that structure and an adjacent neighboring structure. For structures such as nanopores, the above ranges are intended to be approximate diameters. Additionally, the surface structures can be spaced at various average distances from one another. In one aspect, neighboring structures can be spaced at a distance of from about 50 nm to about 50 μm. In another aspect, neighboring structures can be spaced at a distance of from about 50 nm to about 2 μm. Such spacing is intended to be from a center point of one structure to the center point of a neighboring structure.

As used herein, the term "fluence" refers to the amount of energy from a single pulse of laser radiation that passes through a unit area. In other words, "fluence" can be described as the energy density of one laser pulse.

As used herein, the term "target region" refers to an area of a semiconductor material that is intended to be doped or surface modified. The target region of a semiconductor material can vary as the surface modifying process progresses. For example, after a first target region is doped or surface modified, a second target region may be selected on the same semiconductor material.

As used herein, the term "absorptance" refers to the fraction of incident electromagnetic radiation absorbed by a material or device.

As used herein, the term "monolithic" refers to an electronic device in which electronic components are formed on the same substrate. For example, two monolithic pixel elements are pixel elements that are formed on the same semiconductor substrate.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Disclosure

The present disclosure provides semiconductor devices and associated methods that can exhibit various enhanced properties, such as, for example, enhanced light detection properties. More specifically, in one aspect the disclosure relates to image sensor pixels and elements for trapping light within such pixels. In other aspects, various light trapping elements can additionally isolate neighboring pixels in an image sensor. Isolation elements can be configured to optically and/or electrically isolate neighboring pixels from one another in addition to trapping light with in the pixel. It is additionally contemplated that the present disclosure is applicable to other optoelectronic devices such as solar cells, and that all such should be included in the present scope.

In various aspects, image sensors can be front side or backside illuminated, 3D sensors, or any other device or system that incorporate a unique isolation element configured to reduce cross-talk between pixel elements. For example, in one aspect an image sensor can be capable of detecting visible and infrared light, whereas an isolation element associated with such an imager can be designed and configured to reduce and in some cases eliminate electrical and/or optical cross-talk between neighboring pixels from straying visible and infrared light. In some cases, isolation elements can be doped with a dopant that enables the repelling of electrical carriers from the isolation elements or in other words from the side walls of the device. In other cases, isolation elements can include light trapping or reflective materials to optically isolate neighboring pixels. It is additionally contemplated that isolation elements can include both a dopant and a light trapping or reflective material to both electrically and optically isolate the pixels. Moreover, isolation elements can also include surface features formed thereon or associated therewith. Additionally, in some cases a pixel can include a textured region to enhance the detection of infrared light among other things.

In one aspect, a variety of optoelectronic devices are provided such as, without limitation, photosensitive diodes, pixels, and imagers capable of detecting visible and infrared light while exhibiting reduced optical and electrical cross-talk between neighboring pixels or diodes. It is also contemplated that the present scope include methods associated with such devices, including methods of making and using. The present devices can additionally exhibit enhanced absorption and quantum efficiencies. Such devices can also include a plurality of photodiodes or pixels. In some cases, the present devices can achieve a quantum efficiency of 10% for wavelengths at 1064 nm and having a thickness of less than 10 microns. In another embodiment, the present device can achieve a quantum efficiency of about 20% for wavelengths at 940 nm and a thickness of less than 10 microns.

In one aspect, a device can include at least a semiconductor substrate having a first side for receiving incident light and a second side opposite the first side. Either or both the first or second sides can include at least one doped region. Furthermore, the image sensor can include at least one isolation element or feature for at least partially separating and isolating neighboring pixels. FIG. 1 illustrates a simplified drawing of an imager having a first pixel 102 and a second pixel 104, that are formed monolithically on a common semiconductor substrate 106 and are isolated from one another by an isolation element 114. Doped regions 108 and 110 can be disposed on either the first side 120 or second side 122 of the semiconductor substrate, or in some cases on opposite sides of the device. In the present figure, the device is configured such that the first side is capable of receiving incident light. A textured region 112 having surface features is shown on the second side 122 of the semiconductor substrate 106. This architecture having the texture region 112 on the back side 122 can enable enhanced detection and absorption of electromagnetic radiation having wavelengths in the range of about 600 nm to about 1200 nm. It should be noted that this architecture can be used in either a FSI or BSI image sensor architecture. Furthermore, the textured region can be located on the first side 120, the second side 122, or both the first and second sides.

In a typical FSI imager, incident light enters the semiconductor device by first passing by transistors and metal circuitry. The light, however, scatters off of the transistors and circuitry prior to entering the light sensing portion of the imager, thus causing optical loss and noise. A lens can be disposed on the topside of a FSI pixel to direct and focus the incident light to the light sensing active region of the device, thus partially avoiding the circuitry. BSI imagers, one the other hand, are configured to have the light sensing portion of the device opposite the circuitry. Incident light enters the device via the light sensing portion and is at least partially absorbed by the device prior to reaching the circuitry. BSI designs allow for smaller pixel architecture and a high fill factor for the imager. As mentioned, the devices according to aspects of the present disclosure can be adapted for either configuration. It should also be understood that devices according to aspects of the present disclosure can be incorporated into complimentary metal-oxide-semiconductor (CMOS) imager architectures or charge-coupled device (CCD) imager architectures, as well as other optoelectronic devices.

Regarding isolation elements, also referred to herein as trench isolation features or sidewalls, various processes can be employed to form the isolation elements. It is contemplated that the isolation features can extend from either the first surface or the second surface into the semiconductor material and depending on the depth of the trench can be considered either deep trench isolation or shallow trench isolation. The dimensions of the trench can vary, depending on the application. For example, trenches can have parallel walls, or they can have sloping walls, bottle neck architecture, or any other useful configuration. The depth of the trench isolation feature can be in the range of from about 100 nm to about 50 µm depending on the design of the device. The width can be in the range of from about 100 nm to about 10 µm. For simplicity, the figures in this disclosure show deep trench isolation but it should be understood that shallow trench isolation architectures can be utilized, and that deep trench isolation need not completely extend from one side to the other. The processes contemplated for forming trenches or other isolation features can include, reactive ion etch, isotropic plasma etch, wet chemical etch, laser irradiation, or any other known etch technique.

A variety of reflective materials can be utilized in constructing the isolation features in order to provide optical isolation, light trapping, and/or electrical isolation, and any such material capable of incorporation into a photosensitive device is considered to be within the present scope. Non-limiting examples of such materials include a Bragg reflector, a metal reflector, a metal reflector over a dielectric material, a transparent conductive oxide such as zinc oxide, indium oxide, or tin oxide, and the like, including combinations thereof. Non-limiting examples of metal reflector materials can include silver, aluminum, gold, platinum, reflective metal nitrides, reflective metal oxides, and the like, including combinations thereof. In one specific aspect, the dielectric layer can include an oxide layer and the reflecting region can include a metal layer. The surface of the metal layer on an oxide acts as a mirror-like reflector for the incident electromagnetic radiation. In addition, in some aspects trench isolation features can be doped to further affect the properties of the material with respect to electrical isolation.

In one specific aspect, a reflective region can include a transparent conductive oxide, an oxide, and a metal layer. The transparent oxide can be textured and a metal reflector deposited thereupon. The textured surface of the metal on a roughened transparent conductive oxide can act as a diffusive scattering site for the incident electromagnetic radiation.

Figure 2:
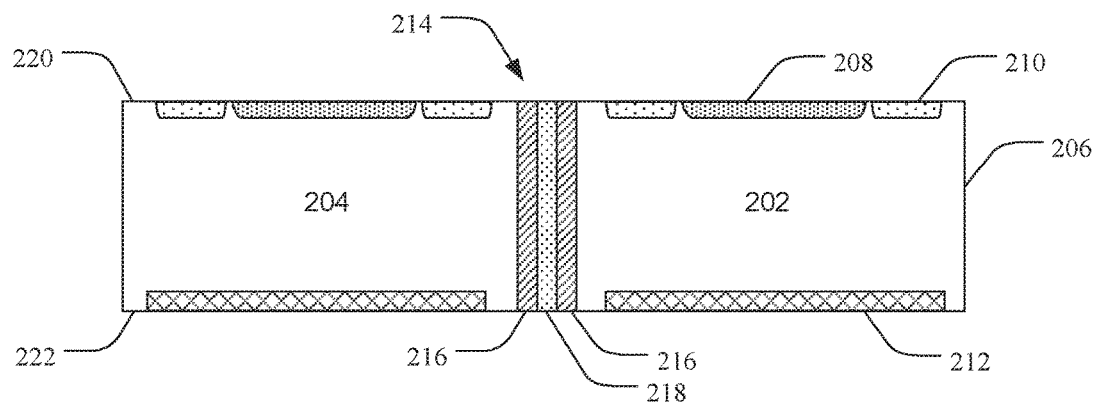
FIG. 2 is a cross-sectional view of multiple image sensor pixels in accordance with another embodiment of the present disclosure.

In some cases, materials having disparate properties can be utilized in the trench isolation features in order to derive a useful combined interaction. As is shown in FIG. 2, for example, an imager having at least two pixels or photodiodes (202 and 204) and at least one isolation element 214. The pixels are shown formed monolithically on a common semiconductor substrate 206. Doped regions 208 and 210 can be disposed on either the first side 220 or second side 222 of the semiconductor substrate. A textured region 212 having surface features is created on the second side 222 of the semiconductor substrate 206.

In some aspects, the isolation element 214 can be designed to function as a Bragg reflector. In such cases, the isolation element 214 includes at least two layers 216 comprised of material having a lower refractive index (n) as compared to the material of the third layer 218 disposed or sandwiched therebetween. In other words, the isolation element includes a high refractive index material sandwiched between two low refractive index materials, and such a configuration forms a Bragg reflector. Additionally, in some aspects the low reflective index materials can be chosen to have a lower refractive index as compared to the semiconductor substrate 206.

Furthermore, in another aspect an isolation element or light trapping material can include a higher refractive index material sandwiched between two materials having a refractive index that is at least 0.2 lower as compared to the higher refractive index material. In this case, the materials are not limited by the definition of low vs. high refractive index outlined below, but are rather defined by the relative difference in refractive index. For example, in one aspect a light trapping material can include silicon dioxide/silicon nitride/silicon dioxide, each material of which would be considered to be a low refractive index material. There is, however, a greater than 0.2 difference in the refractive indexes between silicon dioxide and silicon nitride, and thus such an isolation element would be included within the present scope. It is also noted that the light trapping material can have greater than three layers. As one non-limiting example, a material can have silicon dioxide/silicon nitride/polysilicon/silicon nitride/silicon dioxide.

As has been described, in some aspects a Bragg reflector can be utilized as an isolation element to trap electromagnetic radiation within the pixel. A Bragg reflector is a structure formed from multiple layers of alternating materials with varying refractive indexes, or by a periodic variation of some characteristic (e.g. height) of a dielectric waveguide, resulting in periodic variation in the effective refractive index in the guide. Each layer boundary causes a partial reflection of an optical wave. For waves whose wavelength is close to four times the optical thickness of the layers, the many reflections combine with constructive interference, and the layers act as a high-quality reflector. Thus the coherent super-positioning of reflected and transmitted light from multiple interfaces in the structure interfere so as to provide the desired reflective, transmissive, and absorptive behavior. In one aspect, a Bragg reflector can be made as in FIG. 2, whereby a high refractive index material sandwiched between two low refractive index materials. In one specific aspect, for example, the Bragg reflector can be constructed of a layer of polysilicon sandwiched between two layers of silicon dioxide. Because of the high refractive index difference between silicon and silicon dioxide, and the thickness of these layers, this structure can be fairly low loss even in regions where bulk silicon absorbs appreciably. Additionally, because of the large refractive index difference, the optical thickness of the entire layer set can be thinner, resulting in a broader-band behavior and fewer fabrications steps.

In terms of optical isolation from pixel to pixel, the large index of refraction mismatch can result in total reflection at the trench side walls. To prevent excessive dark current in the pixels, a passivation layer may be disposed on the side walls of the trench to prevent the generation of carriers and leakage current. Silicon nitride deposited over a thin grown oxide layer is also commonly used, in this case the oxide may be a low temperature grown plasma oxide.

It can be shown through calculations that a low recombination velocity of silicon oxide and silicon nitride is the result of moderately high positive oxide charge ($5 \times 10^{11}$ to $1 \times 10^{12}$ $cm^{-2}$) and relatively low midgap interface state density ($1 \times 10^{10}$ to $4 \times 10^{10}$ $cm^{-2}$ $eV^{-1}$). The addition of silicon oxide or nitride can reduce surface recombination and surface generation. Reducing the surface recombination can increase quantum efficiency of photon collection and surface generation can cause excessive dark current in the imagers thereby reducing the quality of the image.

Since the positive oxide charge of silicon nitride or silicon oxynitride is relatively low on silicon on insulator imagers a p-type layer can be adjacent the silicon oxide, silicon oxynitride and/or silicon nitride layers as an alternative embodiment. In this case the p-type layer will accumulate the surface or the backside of the p-type silicon layer and p-type sidewalls.

Other possible passivation techniques include a hot steam anneal of hydrogenated silicon nitride or the use of amorphous silicon.

Aluminum oxide can also be deposited in the trench to form an isolating barrier. Aluminum oxide can have low stress, a negative fixed charge and higher index of refraction than silicon oxide or low stress silicon oxynitride nitride. Low surface recombination velocities, as low as 10 cm/s can be obtained through various deposition processes of $Al_2O_3$ layers on the silicon substrate. Low surface recombination can be achieved by field induced surface passivation due to a high density of negative charges stored at the interface. PECVD aluminum oxide is described here for the backside passivation of the backside and backside trenches in backside illuminated image sensors.

The index of refraction of the aluminum oxide can be increased slightly as required by the addition of other metallic elements to make ternary insulators like Aluminum Oxynitride (AlON), Hafnium Aluminum Oxide (HfAlO), Zirconium Aluminum Oxide (ZrAlO), Lanthanum Aluminum Oxide (LaAlO), Titanium Aluminum Oxide (TiAlO) or quaternary dielectrics like Hafnium Aluminum Oxynitride (HfAlON), Tantalum Aluminum Oxynitride (TaAlON), Lanthanum Aluminum Oxynitride (LaAlON).

Low temperature PECVD deposition processes are contemplated for the backside passivation of the backside and backside trenches in backside illuminated image sensors. As previously mentioned the large index of refraction mismatch between silicon and the insulators in the trenches results in reflection of the incident light and provides optical isolation. The trenches also provide electrical isolation. Additionally, it can also be beneficial to dope the sidewalls to create a surface field that will improve electrical isolation between the pixels. In one aspect, it can also be beneficial to dope the low refractive index material of the Bragg-type reflectors to increase such electrical isolation.

Returning to FIG. 2, layers the silicon oxide and polysilicon can optically and electrically isolate the adjacent pixels, as well as function to trap light within the pixel. While any thicknesses capable of forming such a reflector are considered to be within the present scope, layer 216 can have a thickness in the range of from about 50 nm to about 500 nm. Layer 118 can have a thickness in the range of from about 5 nm to about 100 nm. Thus, the difference in refractive indexes and thickness can determine the intensity of the internal reflection of electromagnetic radiation. Notably, other materials such as metals, as well as other material not listed herein can be used to increase internal reflection of the light.

It is noted that, for the purposes of the present disclosure, in one aspect a low refractive index material can have a refractive index of less than about 2.1. In the case of the sandwiched materials, the two low refractive index materials can be the same or different materials having a refractive index of less than about 2.1. Non-limiting examples of low refractive index materials can include oxides, nitrides, oxynitrides, gasses, at least a partial vacuums, and the like, including appropriate combinations thereof. Non-limiting specific examples of such materials can include silicon oxide, silicon nitride, silicon oxynitride, and the like, including combinations thereof. Additionally, a high K dielectric material can also make a suitable low reflective index material due to their low refractive index properties and good dielectric properties, and as such, are considered to be within the present scope. One example is Hafnium oxide, which has a refractive index of about 1.9. Other examples of high K dielectrics include hafnium silicate, zirconium silicate, zirconium dioxide, and the like.

Additionally, in another aspect a high refractive index material can include a material having a refractive index of greater than or equal to about 2.1. Thus, in the case of the sandwiched materials, the high refractive index material disposed between the low refractive index materials has a refractive index of about 2.1 or greater. Non-limiting examples of high refractive index materials can include polycrystalline silicon, amorphous silicon, single crystal silicon, multicrystalline silicon, nanocrystalline silicon, germanium, and the like, including appropriate combinations thereof.

Figure 3:
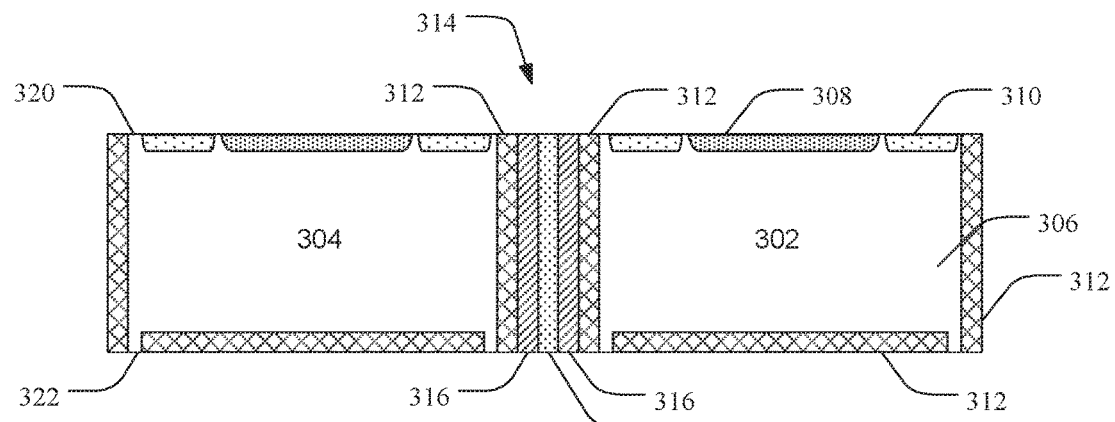
FIG. 3 is a cross-sectional view of multiple image sensor pixels in accordance with another embodiment of the present disclosure.

In still another aspect of the present disclosure, a photosensitive imager having at least two pixels (302 and 304) and at least one trench isolation region 314 is shown in FIG. 3. The pixels can include a semiconductor substrate 306, having a first and second surface, 320 and 322 respectively;

at least two doped regions 308 and 310, and a textured region 312 formed at least on the opposite side of the light incident surface (i.e. the second side 322). The textured region 312 can have surface features configured to reflect and disperse light. Further, the sidewalls can include a texture region 312 to increase the internal reflections of light. Regarding the isolation element 314 in FIG. 3, the isolation element can include several layers of materials that can passivate the sidewalls and each have a different index of refraction, as was described in FIG. 2. Further, a textured region 312 can be formed on the side walls of the isolation element(s) 314.

Figure 4:
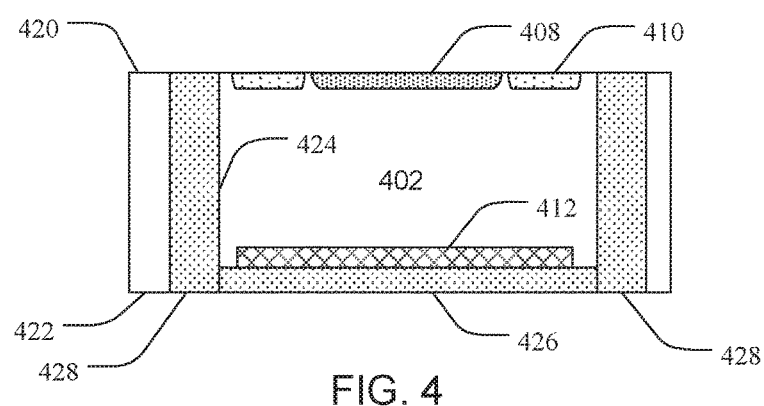
FIG. 4 is a cross-sectional view of a light trapping pixel in accordance with another embodiment of the present disclosure.

The present disclosure additionally provides pixels and imager devices, including imager arrays, which trap light therewithin. In one aspect as is shown in FIG. 4, for example, a light trapping pixel device can include a light sensitive pixel or device 402 having a light incident surface 420, a backside surface 422 opposite the light incident surface 420, and a peripheral sidewall 424 disposed into at least a portion of the pixel 402 and extending at least substantially around the pixel periphery. It is noted that the pixel sidewall is also known as a trench. The pixel can also include a backside light trapping material 426 substantially covering, partially covering, or completely covering the backside surface 422. A peripheral light trapping material 428 can be substantially covering, partially covering, or completely covering the peripheral sidewall 424. As such, light contacting the backside light trapping material 426 or the peripheral light trapping material 428 is reflected back toward the pixel 402. Also shown in FIG. 4 are at least two doped regions 408 and 410 and an optional textured region 412. It is noted that, in addition to a single pixel as shown, pixel arrays are also contemplated and are to be included in the present scope.

The light trapping materials of FIG. 4 can be as described above, either single or multiple layer structures. In one aspect, for example, at least one of the backside light trapping material 426 and the peripheral light trapping material 428 includes a high refractive index material sandwiched between two low refractive index materials. In another aspect, the backside light trapping material 426 and the peripheral light trapping material 428 includes a high refractive index material sandwiched between two low refractive index materials. It is noted that these light trapping materials are shown in FIG. 4 as a single layer for clarity, and that multiple layers are contemplated. Furthermore, the peripheral sidewall can extend for a portion, a substantial portion, or completely around the pixel periphery. Additionally, as has been described herein, the peripheral sidewall can extend partially into the pixel, substantially through the pixel, or completely through the pixel to the backside surface. Thus, both deep and shallow trenches are contemplated.

Figure 5:
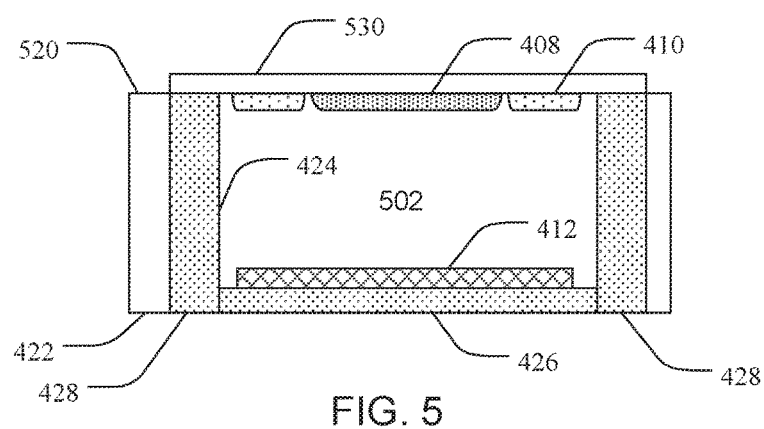
FIG. 5 is a cross-sectional view of a light trapping pixel in accordance with another embodiment of the present disclosure.

In another aspect, as is shown in FIG. 5, a pixel 502 can include a frontside light trapping material 530 that at least partially covers, substantially covers, or completely covers the light incident surface 520. The frontside light trapping material 530 can be multiple layer of materials have a variety of properties and uses, including passivation, antireflection, light trapping, and the like, including combinations thereof. Note that numerical indicators in FIG. 5 from previous figures are intended to reflect the previous descriptions for those elements, and as such, reference is made to FIG. 4.

Figure 6:
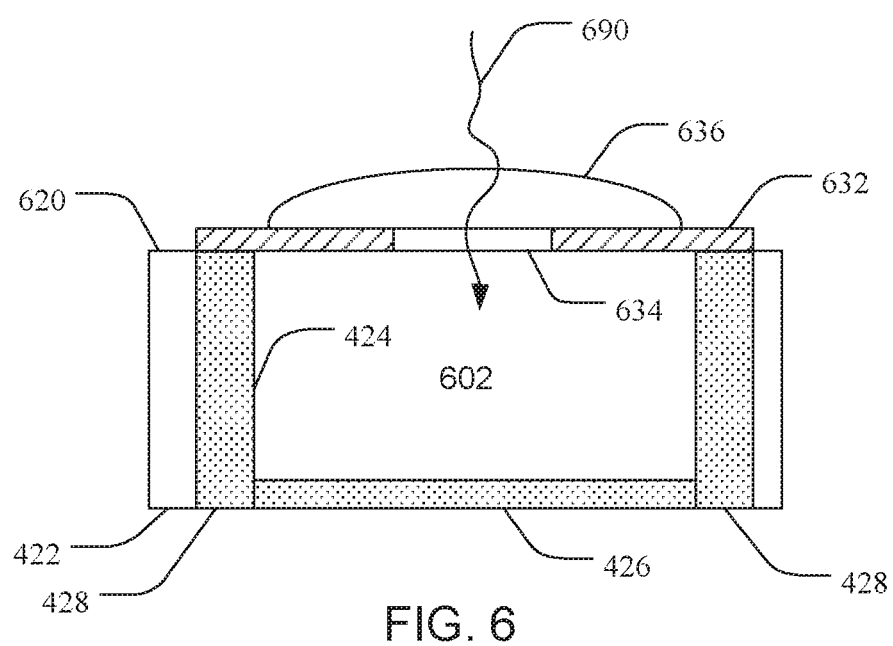
FIG. 6 is a cross-sectional view of a light trapping pixel in accordance with another embodiment of the present disclosure.

In another aspect, as is shown in FIG. 6, a pixel 602 can include a frontside light trapping material 632 associated with the light incident surface 620 that is an internal reflective layer having an aperture 634 to allow entry of light 690 into the pixel 602. The frontside light trapping material 632 is thus operable to reflect light impinging thereupon from inside the pixel 602 back into the pixel. Additionally, in some aspects a lens 636 can be functionally coupled to the aperture 634 to focus incident light 690 through the aperture 634 and into the pixel 602. The effective surface area of the aperture compared to the frontside surface area of the pixel can vary depending on the design of the device and the presence, absence, or particular properties of a lens. In one aspect, however, the aperture can be large enough to accept and trap incoming light to a degree that increases the efficiency of the pixel. In one specific aspect, the aperture has an effective surface area of less than about 90% of the incident light surface total surface area. It is noted that various elements such as the doped regions and the optional textured layer are not shown in FIG. 6 for clarity. Furthermore, numerical indicators in FIG. 6 from previous figures are intended to reflect the previous descriptions for those elements, and as such, reference is made to FIG. 4.

The frontside light trapping material can be made of a variety of materials including metals as have been described herein with respect to other light trapping materials. As such, any material that can be applied to the light incident surface and that is internally reflective toward the inside of the pixel is considered to be within the present scope. Thus, the aforementioned pixel is reflective on 6 internal sides, and as such, light entering the pixel that is not absorbed will interact with and be reflected internally be either the backside, peripheral sidewall, or frontside light trapping materials. Light is thus effectively maintained inside the pixel until it is absorbed.

Figure 7:
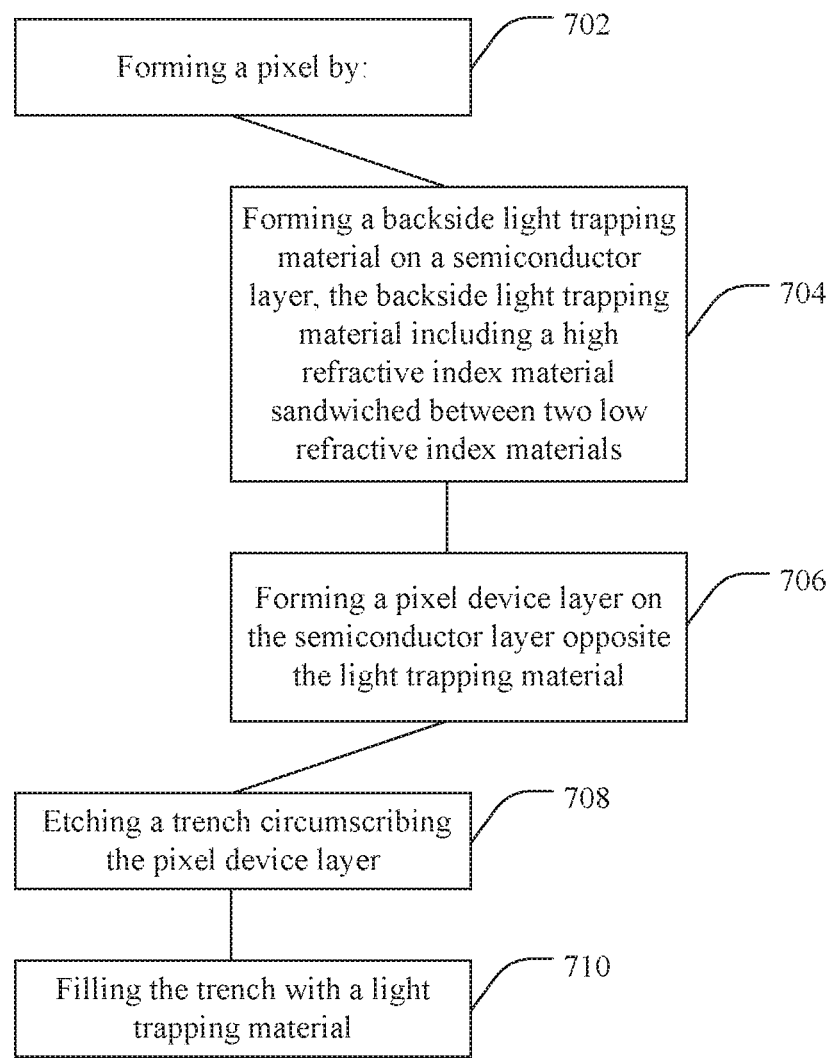
FIG. 7 is a depiction of a method of making a light trapping pixel in accordance with yet another aspect of the present disclosure.

In another aspect of the present disclosure, a method of making a light trapping pixel device is provided. Such a method can include, as is shown in FIG. 7, 702 forming a pixel by: 704 forming a backside light trapping material on a semiconductor layer, the backside light trapping material including a high refractive index material sandwiched between two low refractive index materials, and 706 forming a pixel device layer on the semiconductor layer opposite the light trapping material. The method can additionally include 708 etching a trench circumscribing the pixel device layer and 710 filling the trench with a light trapping material. Further details regarding the wafer bonding and wafer-bonded structures described can be found in copending U.S. application Ser. No. 13/069,135, filed on Mar. 22, 2011, which is incorporated herein by reference.

The formation of the backside light trapping material can be accomplished by a variety of techniques, all of which are considered to be within the present scope. In one aspect, for example, depositing a first low refractive index material onto the semiconductor layer, bonding the first low refractive index material to a high refractive index material having a second low refractive index material coupled thereto such that the high refractive index material is sandwiched in between the first and second low refractive index materials. In some cases the second low refractive index material can be coupled to a carrier wafer. In another aspect, the first low refractive index can be deposited onto the semiconductor layer followed by deposition of the high refractive index material and then the second low refractive index material. In another aspect, the layered structure can be formed on a carrier wafer, and the outermost low refractive index material can then be bonded to the semiconductor layer. The carrier wafer can then be optionally removed. In yet another aspect, the first refractive index material can be deposited onto the semiconductor layer, the second refractive index material can be deposited onto a carrier wafer, and the high refractive index material can be deposited onto either the first or second refractive index material, followed by bonding of the structure together.

As has been described, the trench can be a shallow trench or a deep trench. In one aspect, however, etching the trench circumscribing the pixel device layer can further include etching the trench to a depth that contacts at least the first low refractive index material. Furthermore, the method can also include applying an incident light trapping material to the pixel device layer.

In some aspects the various trenches can be filled with a material, or they can be gas filled or have a partial vacuum applied thereto. For those aspects whereby the trenches will be filled in with a non-gas material, a variety of deposition techniques are contemplated and all are considered to be within the present scope. In one aspect, however, the trench can be filled with a high refractive index material and a low refractive index material in a sandwich structure as has been described. In one exemplary technique, the filling of the trench with such light trapping material can include depositing a low refractive index material into the trench to fill a portion of the trench from the trench walls inward, ceasing deposition of the low refractive index material to leave an internal space within the trench, and depositing a high refractive index material into the trench to fill the internal space. As such, the sandwiched layer of low-high-low refractive index materials is thus created in the trench.

In another aspect, the method can also include forming a textured region on at least a portion of the semiconductor layer between the semiconductor layer and the first low refractive index prior to depositing the first low refractive index material onto the semiconductor layer. Non-limiting examples of texture formation techniques can include plasma etching, reactive ion etching, porous silicon etching, lasing, chemical etching, nanoimprinting, material deposition, selective epitaxial growth, and combinations thereof. In one specific aspect, the textured region includes laser texturing.

A device design having a textured region located on, for example, the back surface of a photodetector, provides significant performance benefits. The textured region can have surface features that can lead to higher recombination of photocarriers for short wavelengths (e.g. in the blue green part of the spectrum) due to the very shallow penetration of those wavelengths into the detecting volume of the device. By physically locating the textured on the back surface of the device, a pristine surface is provided for the collection of short wavelengths on the top surface (i.e. the light incident surface), and the longer wavelengths that penetrate deep into or through the detecting region of the semiconductor material are collected by or with the help of the textured region opposite the light incident surface.

The textured region can be of various thicknesses, depending on the desired use of the material. In one aspect, for example, the textured region has a thickness of from about 500 nm to about 100 µm. In another aspect, the textured region has a thickness of from about 500 nm to about 15 µm. In yet another aspect, the textured region has a thickness of from about 500 nm to about 2 µm. In a further aspect, the textured region has a thickness of from about 500 nm to about 1 µm. In another aspect, the textured region has a thickness of from about 200 nm to about 2 µm.

The textured region can function to diffuse electromagnetic radiation, to redirect electromagnetic radiation, and/or to absorb electromagnetic radiation, thus increasing the quantum efficiency of the device. The textured region can include surface features to further increase the effective absorption length of the device. Non-limiting examples of shapes and configurations of surface features include cones, pillars, pyramids, micolenses, quantum dots, inverted features, gratings, protrusions, sphere-like structures, and the like, including combinations thereof. Additionally, surface features can be micron-sized, nano-sized, or a combination thereof. For example, cones, pyramids, protrusions, and the like can have an average height within this range. In one aspect, the average height would be from the base of the feature to the distal tip of the feature. In another aspect, the average height would be from the surface plane upon which the feature was created to the distal tips of the feature. In one specific aspect, a feature (e.g. a cone) can have a height of from about 50 nm to about 2 µm. As another example, quantum dots, microlenses, and the like can have an average diameter within the micron-sized and/or nano-sized range.

In addition to or instead of surface features, the textured region can include a textured film layer. In one aspect, for example, the textured region can include a substantially conformal textured film layer. Such a textured film layer can have an average thickness of from about 1 nm to about 20 µm. In those aspects where the textured region includes surface features, the conformal textured film layer can have a varying thickness relative to the location on the surface features upon which is deposited. In the case of cones, for example, the conformal textured film layer can become thinner toward the tips of the cones. Such a conformal film layer can include various materials, including, without limitation, $SiO_2$, $Si_3N_4$, amorphous silicon, polysilicon, a metal or metals, and the like, including combinations thereof. The conformal textured film layer can also be one or more layers of the same or different materials, and can be formed during the creation of surface features or in a separate process.

Textured regions according to aspects of the present disclosure can allow a photosensitive device to experience multiple passes of incident electromagnetic radiation within the device, particularly at longer wavelengths (i.e. infrared). Such internal reflection increases the effective absorption length to be greater than the thickness of the semiconductor layer. This increase in absorption length increases the quantum efficiency of the device, leading to an improved signal to noise ratio.

The texturing process can texture the entire substrate to be processed or only a portion of the substrate. In one aspect, for example, a substrate such as the semiconductor layer can be textured and patterned by an appropriate technique over an entire surface to form the texture region. In another aspect, a substrate such as the semiconductor layer can be textured and patterned across only a portion of a surface by using a selective etching technique, such as a mask, photolithography, and an etch or a laser process to define a specific structure or pattern.

In addition to surface features, the textured region can have a surface morphology that is designed to focus or otherwise direct electromagnetic radiation. For example, in one aspect the textured region has a surface morphology operable to direct electromagnetic radiation into the semiconductor layer. Non-limiting examples of various surface morphologies include sloping, pyramidal, inverted pyramidal, spherical, square, rectangular, parabolic, asymmetric, symmetric, and the like, including combinations thereof.

The textured region, including surface features as well as surface morphologies, can be formed by various techniques, including plasma etching, reactive ion etching, porous silicon etching, lasing, chemical etching (e.g. anisotropic etching, isotropic etching), nanoimprinting, material deposition, selective epitaxial growth, and the like.

One effective method of producing a textured region is through laser processing. Such laser processing allows discrete target areas of a substrate to be textured, as well as entire surfaces. A variety of techniques of laser processing to form a textured region are contemplated, and any technique capable of forming such a region should be considered to be within the present scope. Laser treatment or processing can allow, among other things, enhanced absorption properties and thus increased electromagnetic radiation focusing and detection.

In one aspect, for example, a target region of the substrate to be textured can be irradiated with laser radiation to form a textured region. Examples of such processing have been described in further detail in U.S. Pat. Nos. 7,057,256, 7,354,792 and 7,442,629, which are incorporated herein by reference in their entireties. Briefly, a surface of a substrate material is irradiated with laser radiation to form a textured or surface modified region. Such laser processing can occur with or without a dopant material. In those aspects whereby a dopant is used, the laser can passed through a dopant carrier and onto the substrate surface. In this way, dopant from the dopant carrier is introduced into the target region of the substrate material. Such a region incorporated into a substrate material can have various benefits in accordance with aspects of the present disclosure. For example, the textured region typically has a textured surface that increases the surface area and increases the probability of radiation absorption. In one aspect, such a textured region is a substantially textured surface including micron-sized and/or nano-sized surface features that have been generated by the laser texturing. In another aspect, irradiating the surface of a substrate material includes exposing the laser radiation to a dopant such that irradiation incorporates the dopant into the substrate. Various dopant materials are known in the art, and are discussed in more detail herein.

Thus the surface of the substrate at the target region is thus chemically and/or structurally altered by the laser treatment, which may, in some aspects, result in the formation of surface features appearing as structures or patterned areas on the surface and, if a dopant is used, the incorporation of such dopants into the substrate material. In some aspects, the features or structures can be on the order of 50 nm to 20 µm in size and can assist in the absorption of electromagnetic radiation. In other words, the textured surface can increase the probability of incident radiation being absorbed.

A variety of semiconductor materials are contemplated for use with the pixel devices and methods according to aspects of the present disclosure. Such materials can be utilized as the semiconductor layer and/or the semiconductor substrate, as well as for the secondary semiconductor layer and the epitaxially grown semiconductor layer. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the semiconductor material can be or include silicon. Exemplary silicon materials can include amorphous silicon (a-Si), microcrystalline silicon, multicrystalline silicon, and monocrystalline silicon, as well as other crystal types. In another aspect, the semiconductor material can include at least one of silicon, carbon, germanium, aluminum nitride, gallium nitride, indium gallium arsenide, aluminum gallium arsenide, and combinations thereof.

Exemplary combinations of group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), mercury zinc selenide (HgZnSe), and combinations thereof.

Exemplary combinations of group III-V materials can include aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (AlGaAs, $Al_xGa_{1-x}As$), indium gallium arsenide (InGaAs, $In_xGa_{1-x}As$), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInNAsSb), gallium indium arsenide antimonide phosphide (GaInAsSbP), and combinations thereof.

The semiconductor material can be of any thickness that allows the desired property or functionality of the semiconductor device, and thus any such thickness of semiconductor material is considered to be within the present scope. The textured region can increase the efficiency of the device such that, in some aspects, the semiconductor material can be thinner than has previously been possible. Decreasing the thickness reduces the amount of semiconductor material used to make such a device. In one aspect, for example, a semiconductor material such as the semiconductor layer has a thickness of from about 500 nm to about 50 µm. In another aspect, the semiconductor material has a thickness of less than or equal to about 500 µm. In yet another aspect, the semiconductor material has a thickness of from about 1 µm to about 10 µm. In a further aspect, the semiconductor material can have a thickness of from about 5 µm to about 750 µm. In yet a further aspect, the semiconductor material can have a thickness of from about 5 µm to about 100 µm.

Additionally, various configurations of semiconductor materials are contemplated, and any such material configuration that can be incorporated into a semiconductor device is considered to be within the present scope. In one aspect, for example, the semiconductor material can include monocrystalline materials. In another aspect, the semiconductor material can include multicrystalline materials. In yet another aspect, the semiconductor material can include microcrystalline materials. It is also contemplated that the semiconductor material can include amorphous materials.

As has been described, the semiconductor substrate can be of any size, shape, and material capable of supporting the semiconductor layer and associated components during manufacture and/or use. The semiconductor substrate can be made from various materials, including the semiconductor materials described above, as well as non-semiconductor materials. Non-limiting examples of such materials can include metals, polymeric materials, ceramics, glass, and the like. In some aspects, the semiconductor substrate and the semiconductor layer have the same or substantially the same thermal expansion properties.

Furthermore, the semiconductor material according to aspects of the present disclosure can comprise multiple layers. In some aspects, layers can vary in majority carrier polarity (i.e. donor or acceptor impurities). The donor or acceptor impurities are typically determined by the type of dopant/impurities introduced into the device either through a growth process, deposition process, epitaxial process, implant process, lasing process or other known process to those skilled in the art. In some aspects such semiconductor materials can include an n-type layer, an intrinsic (i-type) layer, and a p-type layer, thus forming a p-i-n semiconductor material stack that creates a junction and/or depletion region. A semiconductor material devoid of an i-type layer is also contemplated in accordance with the present disclosure. In other aspects the semiconductor material may include multiple junctions. Additionally, in some aspects, variations of n(--), n(-), n(+), n(++), p(--), p(-), p(+), or p(++) type semiconductor layers can be used. The minus and positive signs are indicators of the relative magnitude of the doping of the semiconductor material.

A variety of dopant materials are contemplated for both the formation of doped regions in the semiconductor layer and for doping of the textured region, and any dopant that can be used in such processes to modify a material is considered to be within the present scope. It should be noted that the particular dopant utilized can vary depending on the material being doped, as well as the intended use of the resulting material.

A dopant can be either a charge donating or a charge accepting dopant species. More specifically, an electron donating or a hole donating species can cause a region to become more positive or negative in polarity as compared to the substrate upon which the rests. In one aspect, for example, the doped region can be p-doped. In another aspect the doped region can be n-doped.

In one aspect, non-limiting examples of dopant materials can include S, F, B, P, N, As, Se, Te, Ge, Ar, Ga, In, Sb, and combinations thereof. It should be noted that the scope of dopant materials should include, not only the dopant materials themselves, but also materials in forms that deliver such dopants (i.e. dopant carriers). For example, S dopant materials includes not only S, but also any material capable being used to dope S into the target region, such as, for example, $H_2S$, $SF_6$, $SO_2$, and the like, including combinations thereof. In one specific aspect, the dopant can be S. Sulfur can be present at an ion dosage level of from about $5 \times 10^{14}$ to about $3 \times 10^{20}$ ions/cm$^2$. Non-limiting examples of fluorine-containing compounds can include $ClF_3$, $PF_5$, $F_2$ $SF_6$, $BF_3$, $GeF_4$, $WF_6$, $SiF_4$, HF, $CF_4$, $CHF_3$, $CH_2F_2$, $CH_3F_6$, $C_2F_6$, $C_2HF_5$, $C_3F_8$, $C_4F_8$, $NF_3$, and the like, including combinations thereof. Non-limiting examples of boron-containing compounds can include $B(CH_3)_3$, $BF_3$, $BCl_3$, BN, $C_2B_{10}H_{12}$, borosilica, $B_2H_6$, and the like, including combinations thereof. Non-limiting examples of phosphorous-containing compounds can include $PF_5$, $PH_3$, $POCl_3$, $P_2O_5$, and the like, including combinations thereof. Non-limiting examples of chlorine-containing compounds can include $Cl_2$, $SiH_2Cl_2$, HCl, $SiCl_4$, and the like, including combinations thereof. Dopants can also include arsenic-containing compounds such as $AsH_3$ and the like, as well as antimony-containing compounds. Additionally, dopant materials can include mixtures or combinations across dopant groups, i.e. a sulfur-containing compound mixed with a chlorine-containing compound. In one aspect, the dopant material can have a density that is greater than air. In one specific aspect, the dopant material can include Se, $H_2S$, $SF_6$, or mixtures thereof. In yet another specific aspect, the dopant can be $SF_6$ and can have a predetermined concentration range of about $5.0 \times 10^{-8}$ mol/cm$^3$ to about $5.0 \times 10^4$ mol/cm$^3$. As one non-limiting example, $SF_6$ gas is a good carrier for the incorporation of sulfur into a substrate via a laser process without significant adverse effects on the material. Additionally, it is noted that dopants can also be liquid solutions of n-type or p-type dopant materials dissolved in a solution such as water, alcohol, or an acid or basic solution. Dopants can also be solid materials applied as a powder or as a suspension dried onto the wafer.

In another aspect, the band structure optimization can be realized by forming a heterojunction along a modified semiconductor interface. For example, a layer of amorphous silicon can be deposited on the textured region interface, thus forming a heterojunction that bends the minority carrier band towards the desired energy direction.

What is claimed is:

1. An imager device, comprising:
   at least two adjacent light sensitive image sensor pixels each having a light incident surface, and a backside surface opposite the light incident surface;
   a peripheral isolation element at least partially separating said two adjacent light sensitive pixels;
   each of said pixels having at least one doped region disposed on at least one of the light incident surface and the backside surface,
   wherein the peripheral isolation element comprises at least two materials having different indices of refraction,
   wherein said peripheral isolation element comprises a first, a second and a third layer, wherein said third layer is disposed between said first and second layers, and wherein each of said first and second layer exhibits an index of refraction less than an index of refraction of said third layer.

2. The device of claim 1, wherein the index of refraction of at least one of said first and second layer is at least 0.2 lower relative to the refractive index of the third layer.

3. The device of claim 1, wherein at least of one of said at least two materials comprises silicon dioxide.

4. The device of claim 1, wherein at least one of said first and second layers comprises silicon dioxide.

5. The device of claim 1, wherein the isolation element extends substantially from the light incident surface to the backside surface of at least one of said two adjacent light sensitive pixels.

6. The device of claim 1, wherein at least one of the first and second layer comprises $Al_2O_3$.

7. The device of claim 1, wherein said peripheral isolation element comprises an oxide.

8. The device of claim 1, wherein said peripheral isolation element provides a passivating negative charge.

9. The device of claim 1, wherein said peripheral isolation element exhibits a surface recombination velocity as low as 10 cm/s.

10. The device of claim 1, wherein the peripheral isolation element comprises at least one material having an index of refraction of less than about 2.1.

11. The device of claim 1, wherein the peripheral isolation element comprises any of aluminum oxide and hafnium oxide.

12. The device of claim 1, wherein at least one of said two adjacent light sensitive pixels comprises a textured region.

13. The device of claim 12, wherein said textured region is coupled to the light incident surface.

14. The device of claim 13, wherein said light incident surface comprises said textured region.

15. The device of claim 13, wherein said textured region comprises a textured film layer.

16. The device of claim 15, wherein said textured film layer comprises any of silicon dioxide, silicon nitride, amorphous silicon, polysilicon, a metal and combinations thereof.

17. The device of claim 12, wherein said backside surface comprises said textured region.

18. An imager device, comprising:
at least two adjacent light sensitive image sensor pixels each having a light incident surface, and a backside surface opposite the light incident surface;
a peripheral isolation element separating said at least two adjacent light sensitive pixels so as to reduce optical crosstalk therebetween, said isolation element comprising at least two materials having different indices of refraction,
at least one doped region disposed on at least one of the light incident surface and the backside surface,
wherein said peripheral isolation element comprises a first, a second and a third layer, wherein said third layer is disposed between said first and second layers, and wherein each of said first and second layers exhibits an index of refraction less than an index of refraction of said third layer.

19. The device of claim 18, wherein at least one of said light incident surface and said backside surface of at least one of said two adjacent light sensitive pixels comprises a textured region.

20. The device of claim 19, wherein said textured region is a textured film layer.

21. The device of claim 20, wherein said textured film layer comprises any of silicon dioxide, silicon nitride, amorphous silicon, polysilicon, a metal and combinations thereof.

22. The device of claim 19, wherein said textured region reflects at least a portion of light internally incident thereon into the at least one pixel.

23. The device of claim 18, wherein the peripheral isolation element extends from the light incident surface to the backside surface of at least one of said two adjacent light sensitive pixels.

24. The device of claim 18, wherein said at least two materials comprises silicon dioxide and aluminum oxide.

25. The device of claim 19, wherein said at least two pixels are formed monolithically in a common semiconductor substrate.

26. The device of claim 19, wherein the textured region is formed by laser radiation.

27. The device of claim 12, wherein the textured region is formed by one of plasma etching, reactive ion etching, porous silicon etching, lasing, chemical etching, nanoimprinting, material deposition, selective epitaxial growth, and combinations thereof.

28. The device of claim 12, wherein the textured region is formed by laser radiation.

29. The device of claim 12, wherein said textured region is coupled to the backside surface.

30. The device of claim 1, wherein said peripheral isolation element comprises tantalum oxide.

31. The device of claim 30, wherein said tantalum oxide comprises tantalum aluminum oxynitride.

32. The device of claim 1, wherein said peripheral isolation element comprises lanthanum oxide.

33. The device of claim 32, wherein said lanthanum oxide comprises lanthanum aluminum oxide.

34. The device of claim 18, wherein said peripheral isolation element comprises tantalum oxide.

35. The device of claim 34, wherein said tantalum oxide comprises tantalum aluminum oxynitride.

36. The device of claim 18, wherein said peripheral isolation element comprises lanthanum oxide.

37. The device of claim 36, wherein said lanthanum oxide comprises lanthanum aluminum oxide.

38. The device of claim 1, wherein each of said at least two adjacent light sensitive image sensor pixels comprises a semiconductor portion providing said light incident surface and said backside surface, wherein said peripheral isolation element isolates the semiconductor portions of said at least two adjacent light sensitive image sensor pixels.

39. The device of claim 38, wherein said peripheral isolation element optically isolates said semiconductor portions of said at least two adjacent light sensitive image sensor pixels.

40. The device of claim 38, wherein said peripheral isolation element electrically isolates said semiconductor portions of said at least two adjacent light sensitive image sensor pixels.

41. The device of claim 38, wherein an index of refraction of the semiconductor portion of each of said at least two adjacent image sensor pixels is different from indices of refraction of said layers of the peripheral isolation element such that light incident from each of said semiconductor portions on said peripheral isolation element is reflected, thereby providing optical isolation between the pixels.

42. The device of claim 1, wherein said at least two adjacent light sensitive image sensor pixels are formed monolithically on a common semiconductor substrate and are isolated from one another by said peripheral isolation element.

43. The device of claim 1, wherein said peripheral isolation element is a trench isolation element.

44. The device of claim 1, wherein said peripheral isolation element has a width in a range from about 100 nm to about 50 microns.

45. The device of claim 18, wherein each of said at least two adjacent light sensitive image sensor pixels comprises a semiconductor portion providing said light incident surface and said backside surface, wherein said peripheral isolation element isolates the semiconductor portions of said at least two adjacent light sensitive image sensor pixels.

46. The device of claim 45, wherein said peripheral isolation element optically isolates said semiconductor portions of said at least two adjacent light sensitive image sensor pixels.

47. The device of claim 46, wherein said peripheral isolation element electrically isolates said semiconductor portions of said at least two adjacent light sensitive image sensor pixels.

48. The device of claim 47, wherein an index of refraction of the semiconductor portion of each of said at least two adjacent image sensor pixels is different from indices of refraction of said layers of the peripheral isolation element such that light incident from each of said semiconductor portions on said peripheral isolation element is reflected, thereby providing optical isolation between the pixels.

49. The device of claim 18, wherein said at least two adjacent light sensitive image sensor pixels are formed monolithically on a common semiconductor substrate and are isolated from one another by said peripheral isolation element.

50. The device of claim 18, wherein said peripheral isolation element is a trench isolation element.

51. The device of claim 18, wherein said peripheral isolation element has a width in a range from about 100 nm to about 50 microns.

52. The imager device of claim 38, wherein at least one of the first layer and the second layer of said peripheral isolation element and said semiconductor portion of each of said at least two adjacent pixels comprise different materials.

53. The imager device of claim 1, wherein the first layer and the second layer of said peripheral isolation element comprise different materials.

54. The imager device of claim 1, wherein the peripheral isolation element comprises at least three materials.

55. The imager device of claim 1, wherein the peripheral isolation element comprises more than three layers.

56. The imager device of claim 1, wherein the peripheral isolation element comprises a light trapping material filling a trench.

57. The imager device of claim 56, wherein the trench is one of a shallow trench and a deep trench.

58. The imager device of claim 45, wherein at least one of the first layer and the second layer of the peripheral isolation element and said semiconductor portion of each of said at least two adjacent pixels comprise different materials.

59. The imager device of claim 18, wherein the first layer and the second layer of said peripheral isolation element comprise different materials.

60. The imager device of claim 18, wherein the peripheral isolation element comprises at least three materials.

61. The imager device of claim 18, wherein the peripheral isolation element comprises more than three layers.

62. The imager device of claim 18, wherein the peripheral isolation element comprises a light trapping material filling a trench.

63. The imager device of claim 62, wherein the trench is one of a shallow trench and a deep trench.

64. The imager device of claim 1, wherein said peripheral isolation element comprises a trench isolation element formed by filling a trench with said first, said second, and said third layers.

65. The imager device of claim 64, wherein said trench isolation element has a depth in a range of about 100 nm to about 50 microns.

66. The imager device of claim 65, wherein said trench isolation element has a width in a range of about 100 nm to about 10 microns.

67. The imager device of claim 1, wherein said peripheral isolation element is configured to reflect at least a portion of light incident thereon from any of said two adjacent light sensitive pixels back to that pixel.

68. The imager device of claim 67, wherein the peripheral isolation element is further configured to optically isolate said two adjacent light sensitive pixels.

69. The imager device of claim 68, wherein the peripheral isolation element is further configured to electrically isolate said two adjacent light sensitive pixels.

70. The imager device of claim 18, wherein said peripheral isolation element comprises a trench isolation element formed by filling a trench with said first, said second, and said third layers.

71. The imager device of claim 70, wherein said trench isolation element has a depth in a range of about 100 nm to about 50 microns.

72. The imager device of claim 71, wherein said trench isolation element has a width in a range of about 100 nm to about 10 microns.

73. The imager device of claim 18, wherein said peripheral isolation element is configured to reflect at least a portion of light incident thereon from any of said two adjacent light sensitive pixels back to that pixel.

74. The imager device of claim 73, wherein the peripheral isolation element is further configured to optically isolate said two adjacent light sensitive pixels.

75. The imager device of claim 74, wherein the peripheral isolation element is further configured to electrically isolate said two adjacent light sensitive pixels.

76. The imager device of claim 1, wherein the peripheral isolation element comprises a textured region.

77. The imager device of claim 1, wherein the peripheral isolation element further comprises a first textured region between the first layer and one of said adjacent pixels and a second textured region between the second layer and the other one of said adjacent pixels.

78. The imager device of claim 18, wherein the peripheral isolation element comprises a textured region.

79. The imager device of claim 18, wherein the peripheral isolation element further comprises a first textured region between the first layer and one of said adjacent pixels and a second textured region between the second layer and the other one of said adjacent pixels.

80. The imager device of claim 1, wherein the peripheral isolation element comprises five layers.

81. The imager device of claim 80, wherein the five layers include the first layer, the second layer, the third layer, a fourth layer disposed between the first layer and one of said adjacent pixels and a fifth layer disposed between the second layer and the other one of said adjacent pixels.

82. The imager device of claim 18, wherein the peripheral isolation element comprises five layers.

83. The imager device of claim 82, wherein the five layers include the first layer, the second layer, the third layer, a fourth layer disposed between the first layer and one of said adjacent pixels and a fifth layer disposed between the second layer and the other one of said adjacent pixels.

* * * * *